United States Patent
Benveniste et al.

(10) Patent No.: US 7,078,707 B1
(45) Date of Patent: Jul. 18, 2006

(54) ION BEAM SCANNING CONTROL METHODS AND SYSTEMS FOR ION IMPLANTATION UNIFORMITY

(75) Inventors: Victor M. Benveniste, Gloucester, MA (US); Peter L. Kellerman, Essex, MA (US); William F. DiVergilio, Brookline, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 33 days.

(21) Appl. No.: 11/029,052

(22) Filed: Jan. 4, 2005

(51) Int. Cl.
*G21K 5/10* (2006.01)
*H01J 37/08* (2006.01)
(52) U.S. Cl. ................. 250/491.1; 250/492.21
(58) Field of Classification Search ............ 250/492.21
See application file for complete search history.

(56) References Cited

U.S. PATENT DOCUMENTS 5,132,545 A    7/1992  Shono et al.
5,198,676 A    3/1993  Benveniste et al.
5,811,823 A *  9/1998  Blake et al. ............ 250/492.21
5,998,798 A * 12/1999  Halling et al. ......... 250/492.21
6,677,598 B1   1/2004  Benveniste

* cited by examiner

*Primary Examiner*—John R. Lee
*Assistant Examiner*—Jennifer Yantorno
(74) *Attorney, Agent, or Firm*—Eschweiler & Associates, LLC

(57) ABSTRACT

Methods are provided for calibrating an ion beam scanner in an ion implantation system, comprising measuring a plurality of initial current density values at a plurality of locations along a scan direction, where the values individually correspond to one of a plurality of initial voltage scan intervals and one of a corresponding plurality of initial scan time values, creating a system of linear equations based on the measured initial current density values and the initial voltage scan intervals, and determining a set of scan time values that correspond to a solution to the system of linear equations that reduces current density profile deviations. A calibration system is provided for calibrating an ion beam scanner in an ion implantation system, comprising a dosimetry system and a control system.

20 Claims, 12 Drawing Sheets

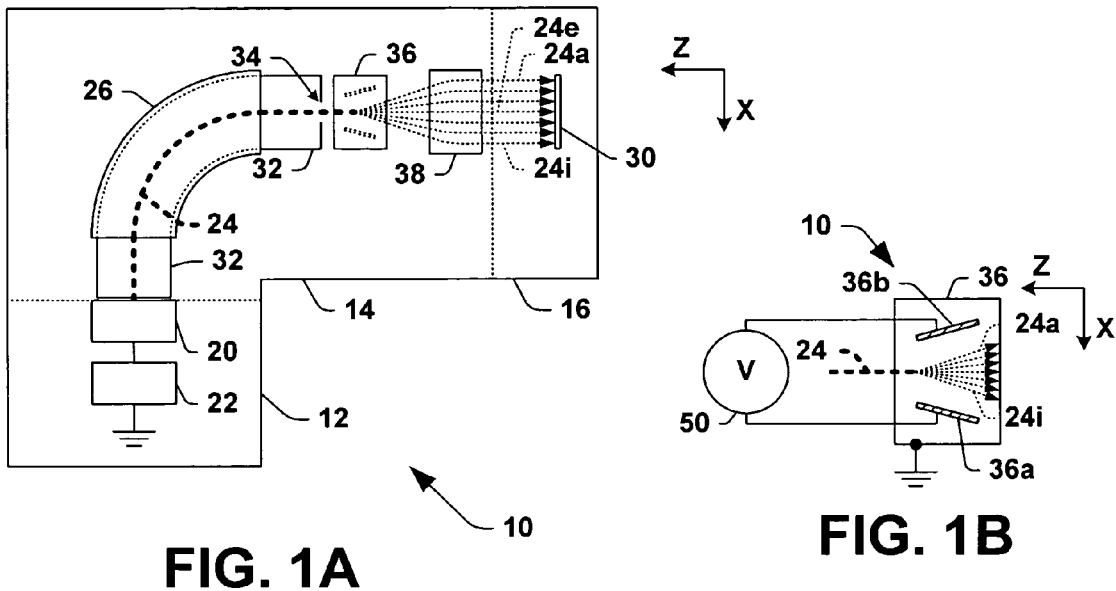
FIG. 1A
FIG. 1B
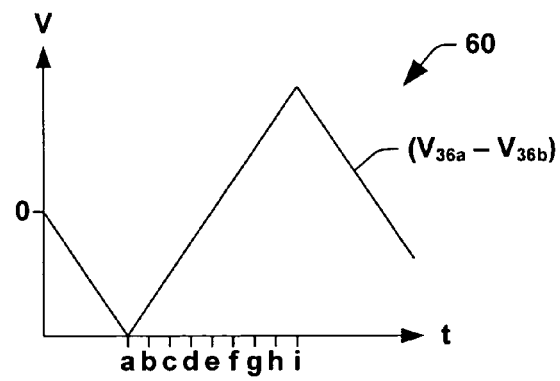
FIG. 1C
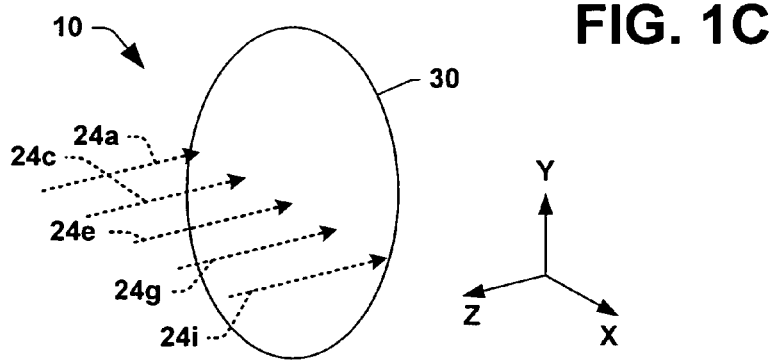
FIG. 1D

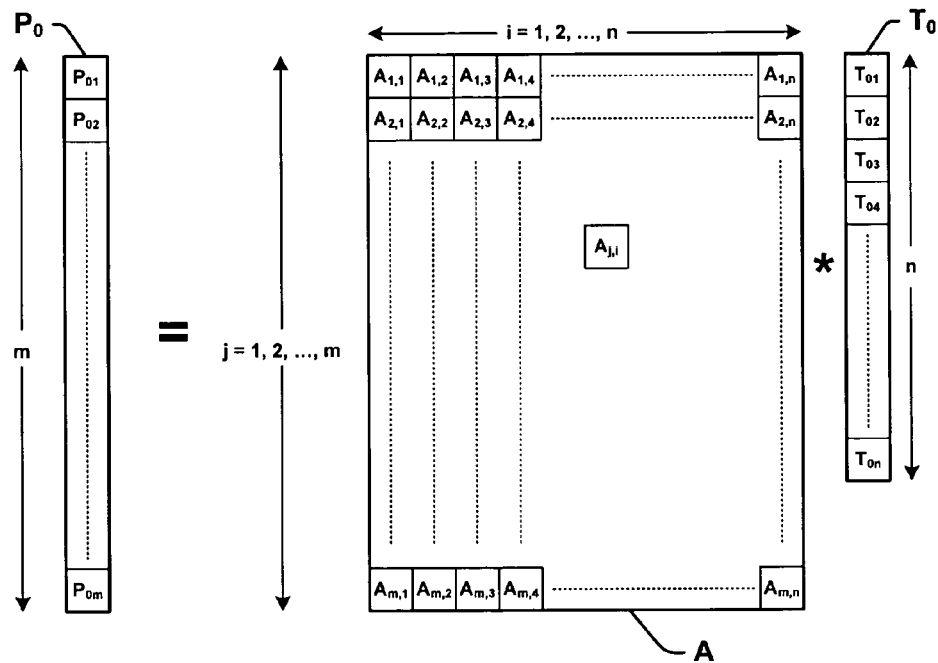
FIG. 6A
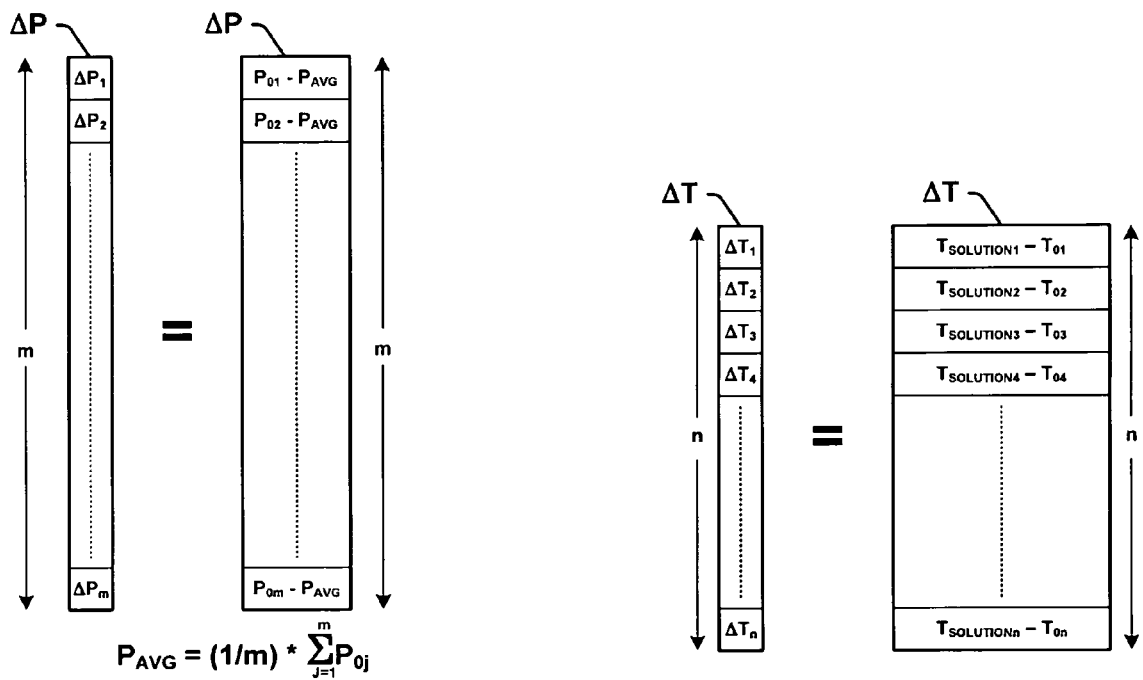
FIG. 6B
FIG. 6C

ION BEAM SCANNING CONTROL METHODS AND SYSTEMS FOR ION IMPLANTATION UNIFORMITY

FIELD OF THE INVENTION

The present invention relates generally to ion implantation systems, and more specifically to improved systems and methods for uniformly scanning ion beams across a workpiece.

BACKGROUND OF THE INVENTION

In the manufacture of semiconductor devices and other products, ion implantation is used to dope semiconductor wafers, display panels, or other workpieces with impurities. Ion implanters or ion implantation systems treat a workpiece with an ion beam, to produce n or p-type doped regions or to form passivation layers in the workpiece. When used for doping semiconductors, the ion implantation system injects a selected ion species to produce the desired extrinsic material, wherein implanting ions generated from source materials such as antimony, arsenic or phosphorus results in n-type extrinsic material wafers, and implanting materials such as boron, gallium or indium creates p-type extrinsic material portions in a semiconductor wafer.

FIG. 1A illustrates an exemplary ion implantation system 10 having a terminal 12, a beamline assembly 14, and an end station 16. The terminal 12 includes an ion source 20 powered by a high voltage power supply 22 that produces and directs an ion beam 24 to the beamline assembly 14. The beamline assembly 14 has a beamguide 32 and a mass analyzer 26 in which a dipole magnetic field is established to pass only ions of appropriate charge-to-mass ratio through a resolving aperture 34 at an exit end of the beamguide 32 to a workpiece 30 (e.g., a semiconductor wafer, display panel, etc.) in the end station 16. The ion source 20 generates charged ions that are extracted from the source 20 and formed into the ion beam 24, which is directed along a beam path in the beamline assembly 14 to the end station 16. The ion implantation system 10 may include beam forming and shaping structures extending between the ion source 20 and the end station 16, which maintain the ion beam 24 and bound an elongated interior cavity or passageway through which the beam 24 is transported to the workpiece 30 supported in the end station 16. The ion beam transport passageway is typically evacuated to reduce the probability of ions being deflected from the beam path through collisions with air molecules.

Low energy implanters are typically designed to provide ion beams of a few thousand electron volts (keV) up to around 80–100 keV, whereas high energy implanters can employ linear acceleration (linac) apparatus (not shown) between the mass analyzer 26 and the end station 16 to accelerate the mass analyzed beam 24 to higher energies, typically several hundred keV, wherein DC acceleration is also possible. High energy ion implantation is commonly employed for deeper implants in the workpiece 30. Conversely, high current, low energy ion beams 24 are typically employed for high dose, shallow depth ion implantation, in which case the lower energy of the ions commonly causes difficulties in maintaining convergence of the ion beam 24.

In the manufacture of integrated circuit devices, display panels, and other products, it is desirable to uniformly implant the dopant species across the entire surface of the workpiece 30. Different forms of end stations 16 are found in conventional implanters. "Batch" type end stations can simultaneously support multiple workpieces 30 on a rotating support structure, wherein the workpieces 30 are rotated through the path of the ion beam until all the workpieces 30 are completely implanted. A "serial" type end station, on the other hand, supports a single workpiece 30 along the beam path for implantation, wherein multiple workpieces 30 are implanted one at a time in serial fashion, with each workpiece 30 being completely implanted before implantation of the next workpiece 30 begins.

The implantation system 10 includes a serial end station 16, wherein the beamline assembly 14 includes a beam scanner 36 that receives the ion beam 24 having a relatively narrow profile (e.g., a "pencil" beam), and scans the beam 24 back and forth in the X direction to spread the beam 24 out into an elongated "ribbon" profile, having an effective X direction width that is at least as wide as the workpiece 30. The ribbon beam 24 is then passed through a parallelizer 38 that directs the ribbon beam toward the workpiece 30 generally parallel to the Z direction (e.g., generally perpendicular to the workpiece surface).

Referring also to FIGS. 1B–1J, the beam scanner 36 is further illustrated in FIG. 1B, having a pair of scan plates or electrodes 36a and 36b on either lateral side of the beam path, and a voltage source 50 that provides alternating voltages to the electrodes 36a and 36b, as illustrated in a waveform diagram 60 in FIG. 1C. The time-varying voltage potential between the scan electrodes 36a and 36b creates a time varying electric field across the beam path therebetween, by which the beam 24 is bent or deflected (e.g., scanned) along a scan direction (e.g., the X direction in FIGS. 1A, 1B, and 1F–1J). When the scanner electric field is in the direction from the electrode 36a to the electrode 36b (e.g., the potential of electrode 36a is more positive than the potential of electrode 36b, such as at times "a" and "c" in FIG. 1C), the positively charged ions of the beam 24 are subjected to a lateral force in the negative X direction (e.g., toward the electrode 36b). When the electrodes 36a and 36b are at the same potential (e.g., zero electric field in the scanner 36, such as at time "e" in FIG. 1C), the beam 24 passes through the scanner 36 unmodified. When the field is in the direction from the electrode 36b to the electrode 36a (e.g., times "g" and "i" in FIG. 1C), the positively charged ions of the beam 24 are subjected to a lateral force in the positive X direction (e.g., toward the electrode 36a).

FIG. 1B shows the scanned beam 24 deflection as it passes through the scanner 36 at several exemplary discrete points in time during scanning prior to entering the parallelizer 38 and FIG. 1D illustrates the scanned and parallelized beam 24 impacting the workpiece 30 at the corresponding times indicated in FIG. 1C. The scanned and parallelized ion beam 24a in FIG. 1D corresponds to the applied electrode voltages at the time "a" in FIG. 1C, and subsequently, the beam 24b–24i is illustrated in FIG. 1D for scan voltages at corresponding times "c", "e", "g", and "i" of FIG. 1C for a single generally horizontal scan across the workpiece 30 in the X direction. FIG. 1E illustrates a simplified scanning of the beam 24 across the workpiece 30, wherein mechanical actuation (not shown) translates the workpiece 30 in the positive Y (slow scan) direction during X (fast scan) direction scanning by the scanner 36, whereby the beam 24 is imparted on the entire exposed surface of the workpiece 30.

Prior to entering the scanner 36, the ion beam 24 typically has a width and height profile of non-zero X and Y dimensions, respectively, wherein one or both of the X and Y dimensions of the beam typically vary during transport due to space charge and other effects. For example, as the beam 24 is transported along the beam path toward the workpiece 30, the beam 24 encounters various electric and/or magnetic fields and devices that may alter the beam width and/or height or the ratio thereof. In addition, space charge effects, including mutual repulsion of positively charged beam ions, tend to diverge the beam (e.g., increased X and Y dimensions), absent countermeasures.

Also, the geometry and operating voltages of the scanner 36 provide certain focusing properties with respect to the beam 24 that is actually provided to the workpiece 30. Thus, even assuming a perfectly symmetrical beam 24 (e.g., a pencil beam) entering the scanner 36, the bending of the beam 24 by the scanner 36 changes the beam focusing, wherein the incident beam typically is focused more at the lateral edges in the X direction (e.g., 24a and 24i in FIG. 1D), and will be focused less (e.g., wider or more divergent) in the X dimension for points between the lateral edges (e.g., 24c, 24e, and 24g in FIG. 1D).

FIGS. 1F–1J illustrate the incident beam 24 corresponding to the scanned instances 24a, 24c, 24e, 24g, and 24i, respectively. As the beam 24 is scanned across the wafer 30 in the X direction, the X direction focusing of the scanner 36 varies, leading to increased lateral defocusing of the incident beam 24 as it moves toward the center, and then improved focusing as the beam 24 again reaches the other lateral edge. For no scanning, the beam 24e proceeds directly to the center of the workpiece 30, at which the incident beam 24e has an X direction width $W_C$, as shown in FIG. 1H. As the beam 24 is scanned laterally in either direction away from the center, however, the time varying focusing properties of the scanner 36 lead to stronger and stronger lateral focusing of the incident beam. For instance, at the outermost edges of the workpiece 30, the incident beam 24a in FIG. 1F has a first left side width $W_{L1}$, and on the right side, the incident beam 24i in FIG. 1J has a first right side width $W_{R1}$. FIGS. 1G and 1I illustrate two intermediate beams 24c and 24g having incident beam widths $W_{L2}$ and $W_{R2}$, respectively, showing X direction focal variation between the edges and the center of the workpiece 30.

In general, it is desirable to provide uniform implantation of the surface of the workpiece 30, regardless of the particular focal properties of the beam transport and scanning system. Accordingly, conventional systems often undergo a calibration operation to adjust the voltage waveform of the beam scanner 36 to counteract the focal variation of the beam 24 along the scan direction and/or to compensate for other beam irregularities. This is typically done in a point-to-point fashion by measuring a current density profile in a region at or near the workpiece location that results from a beam set to the region. The profile region and the scanner voltage range are subdivided into corresponding intervals. For a given scanner voltage interval, a measurement sensor is located at the position corresponding to the center of the interval, and the beam is directed at the region being measured. Such measurements are then repeated for each of the voltage intervals, and the final scan waveform is adjusted to compensate for profile non-uniformities.

Although the conventional point-to-point scanner calibration techniques may be adequate where the width of the ion beam 24 is narrow and the beam width is relatively constant across the target area, these techniques are less suitable in the case of wider beams 24 and/or in situations where the beam width varies along the scan direction, as in the example of FIGS. 1F–1J. In particular, if the beam 24 is wide and/or variable across the target area, the point-to-point technique fails to account for the workpiece dose produced by the beam some distance from the beam center. This situation is particularly problematic with low energy ion beams 24 that experience space charge expansion (e.g., lateral divergence in the scan or X direction).

Another consideration is the amount of beam overscan, which includes the extent to which the ion beam 24 is scanned past the edges of the workpiece 30, as illustrated in FIG. 1E. In most applications, the beam 24 must be scanned beyond the target by an amount related to the width of the beam 24 in order to achieve uniform implantation of the entire workpiece surface. However, the time that the scanned beam 24 spends outside the target area is essentially wasted, and detracts from the system scan efficiency, defined as the time spent on the target workpiece 30 divided by the total scan time.

Accordingly there is a need for improved ion beam scanner calibration techniques by which uniform implantation can be facilitated, and which facilitates improved scan efficiency by determining the minimum overscan required to achieve uniform implantation of a workpiece.

SUMMARY OF THE INVENTION

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

The present invention relates to systems and methods for calibrating an ion beam scanner in an ion implantation system, in which the current density contributions of multiple scanner voltage intervals are individually measured for multiple profile points along a beam scan direction to generate a system of linear equations, and a set of scan time values are computed for the voltage scan intervals corresponding to a solution that reduces current density profile deviations. Unlike conventional point-to-point calibration techniques, the invention provides compensation for implant contributions produced by the beam some distance from the beam center, and is thus particularly suitable for use in low energy ion implanters having relatively wide beams and/or in situations where the lateral beam width varies along the scan direction to provide uniform implantation across a workpiece surface. In addition, the invention may be employed to reduce excess overscan, thereby improving system scan efficiency without sacrificing implant uniformity.

One aspect of the invention provides a method for calibrating an ion beam scanner in an ion implantation system, comprising measuring a plurality of initial current density values at a plurality of locations along a scan direction, where the initial current density values individually correspond to one of a plurality of initial voltage scan intervals and to one of a corresponding plurality of initial scan time values. The method further comprises creating a system of linear equations based on the measured initial current density values and initial scan time values, and determining a set of scan time values for the voltage scan intervals that correspond to a solution to the system of linear equations that reduces current density profile deviations.

Another aspect of the invention provides a calibration system for calibrating an ion beam scanner in an ion implantation system. The calibration system comprises a dosimetry system and a control system operably coupled with the dosimetry system and a power supply associated with a beam scanner, where the dosimetry system measures a plurality of initial current density values at a plurality of locations along a scan direction in a workpiece location of an ion implantation system. The control system causes the scanner to scan an ion beam across the workpiece location of the ion implantation system in the scan direction according to an initial set of voltage scan intervals and corresponding scan time values so that the dosimetry system can measure a plurality of initial current density values at the plurality of locations along the scan direction in a workpiece location of an ion implantation system, where the initial current density values individually correspond to one of the plurality of initial voltage scan intervals and to one of the corresponding plurality of initial scan time values. The control system is further operable to create a system of linear equations based on the measured initial current density values and the initial scan time values, and to determine a set of scan time values for the voltage scan intervals corresponding to a solution to the system of linear equations that reduces current density profile deviations.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIG. 1A is a schematic diagram illustrating an ion implantation system with a conventional scanner and parallelizer;

FIG. 1B is a partial top plan view illustrating the scanner of FIG. 1B and several exemplary scanned ion beams;

FIG. 1C is a graph illustrating an exemplary triangular scanning plate voltage waveform in the scanner of FIGS. 1A and 1B;

FIG. 1D is a perspective view illustrating a scanned ion beam striking a workpiece in the system of FIGS. 1A and 1B at several discrete points in time;

FIG. 6A is a schematic diagram illustrating an exemplary set of linear equations in accordance with the invention;

FIG. 6B is a schematic diagram illustrating an exemplary profile deviation vector in accordance with the invention;

FIG. 6C is a schematic diagram illustrating an exemplary time deviation vector in accordance with the invention;

DETAILED DESCRIPTION OF THE INVENTION

Figure 1E:
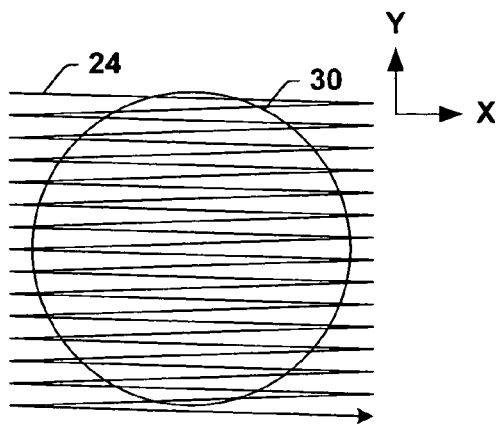
FIG. 1E is an end elevation view illustrating scanning of an ion beam across a workpiece.
Figure 1F:
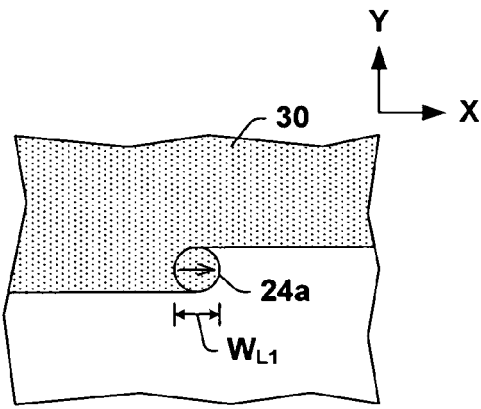
FIGS. 1F–1J are partial front elevation views illustrating variation in the ion beam width upon striking the workpiece in the ion implantation system of FIGS. 1A and 1B.
Figure 1G:
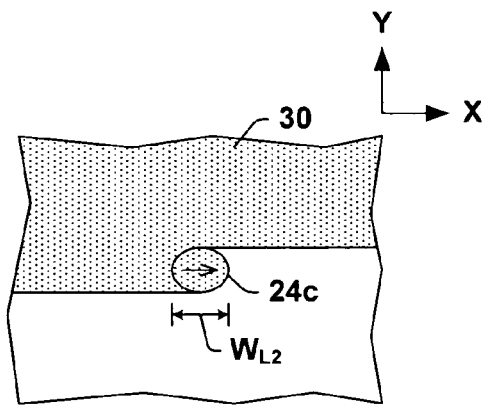
Figure 1H:
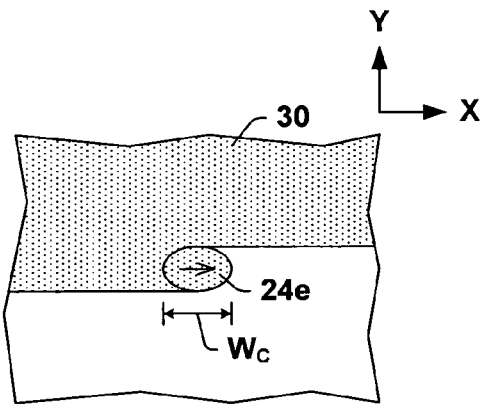
Figure 1I:
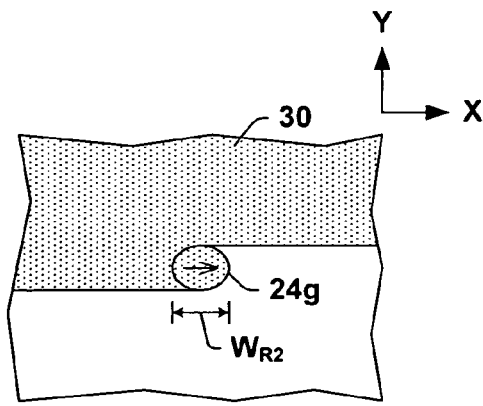
Figure 1J:
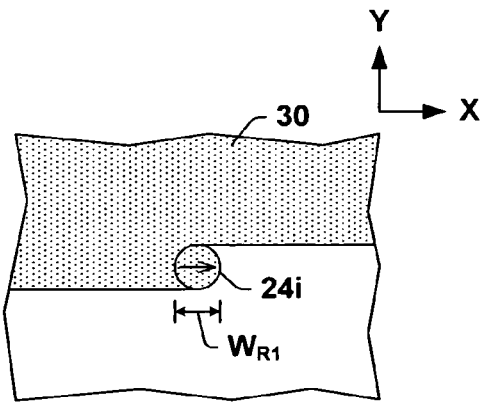

The present invention will now be described with reference to the drawings wherein like reference numerals are used to refer to like elements throughout, and wherein the illustrated structures are not necessarily drawn to scale. The invention provides methods and systems for calibrating an ion beam scanner in an ion implantation system, which may be employed to improve implant uniformity and to improve system scan efficiency by reducing excess overscan.

Figure 2:
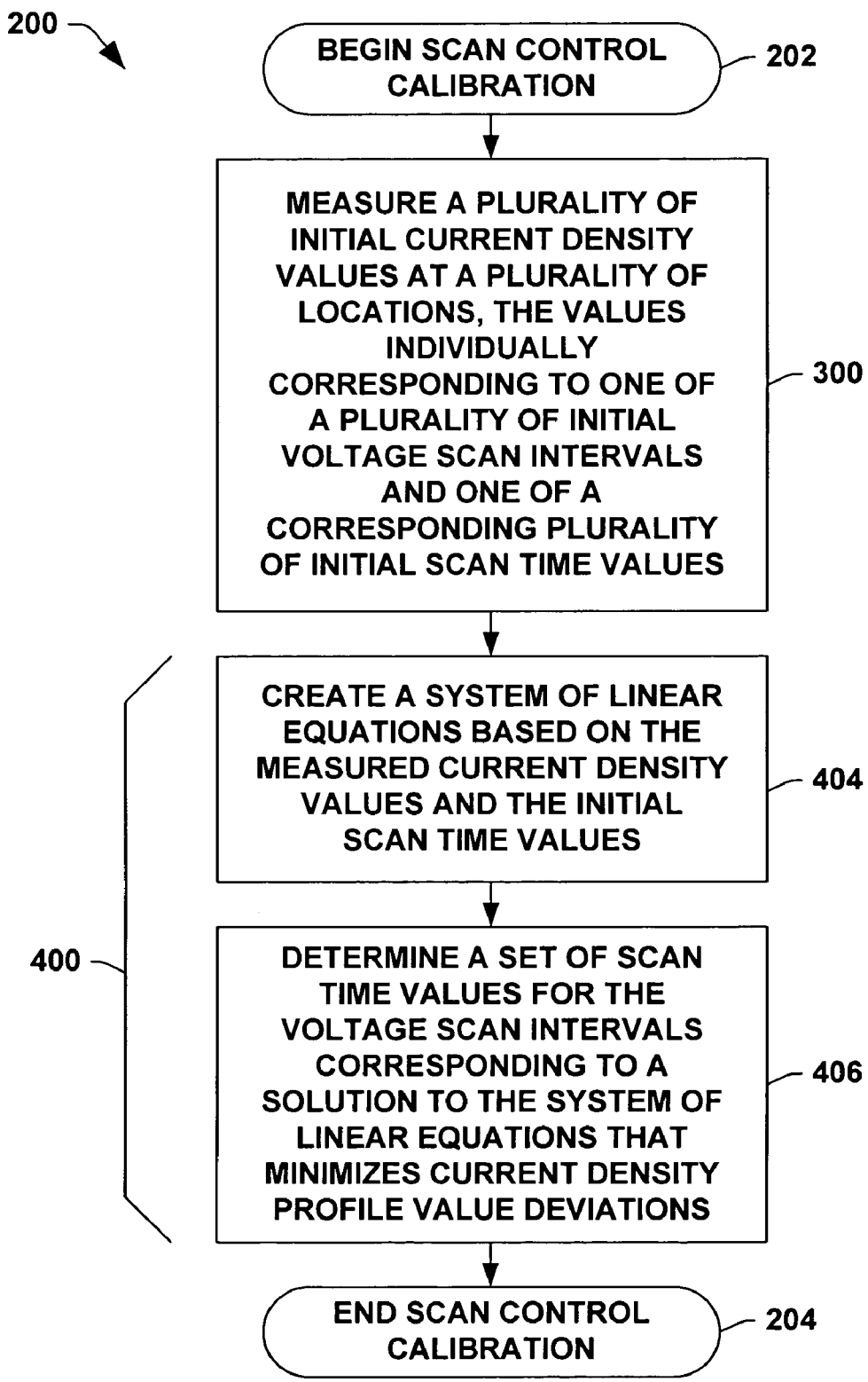
FIG. 2 is a flow diagram illustrating an exemplary beam scanner calibration method in accordance with one or more aspects of the present invention.
Figure 3A:
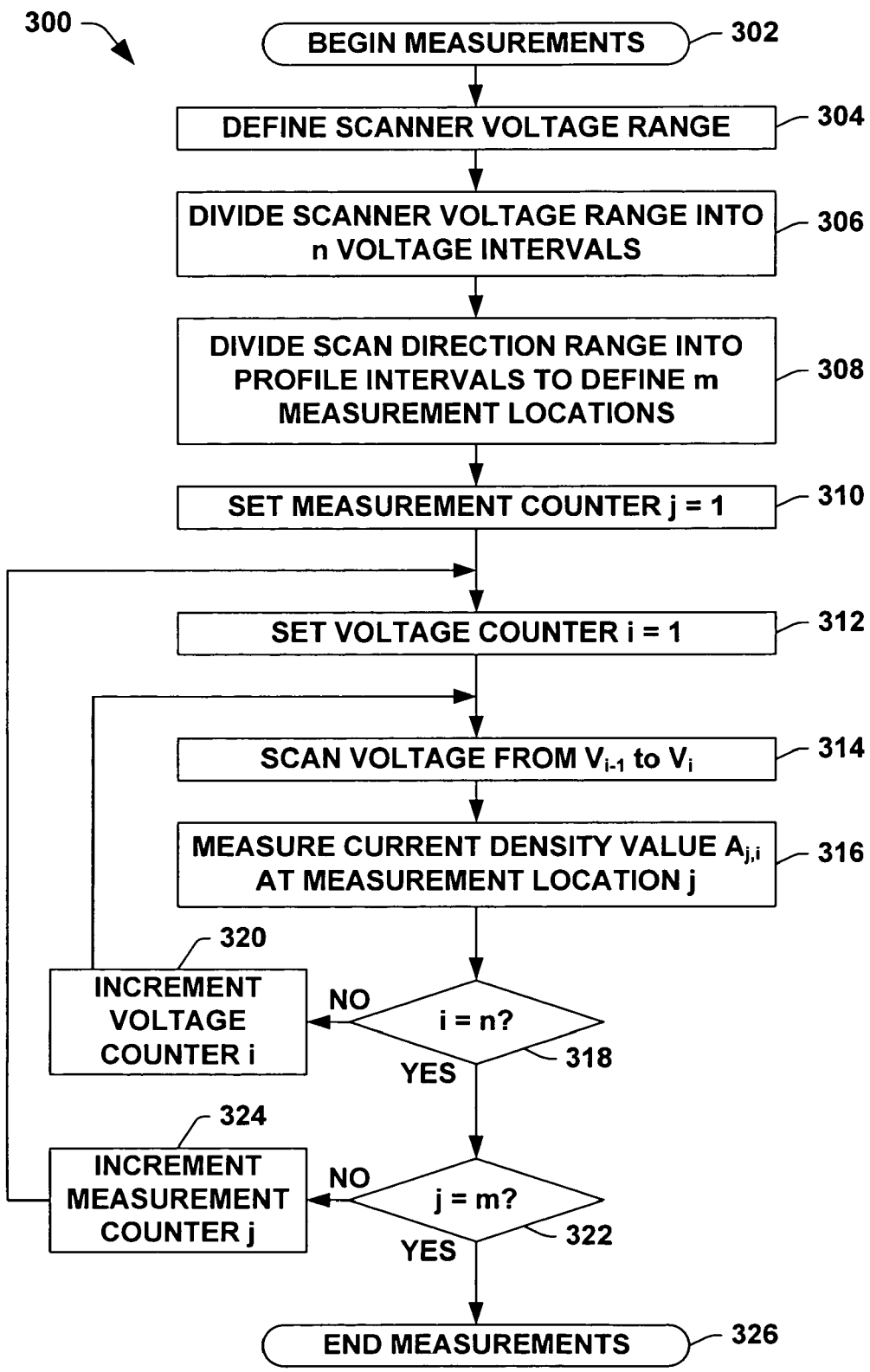
FIG. 3A is a flow diagram illustrating an exemplary measurement sequence that may be employed in the method of FIG. 2 in accordance with one aspect of the invention.
Figure 5:
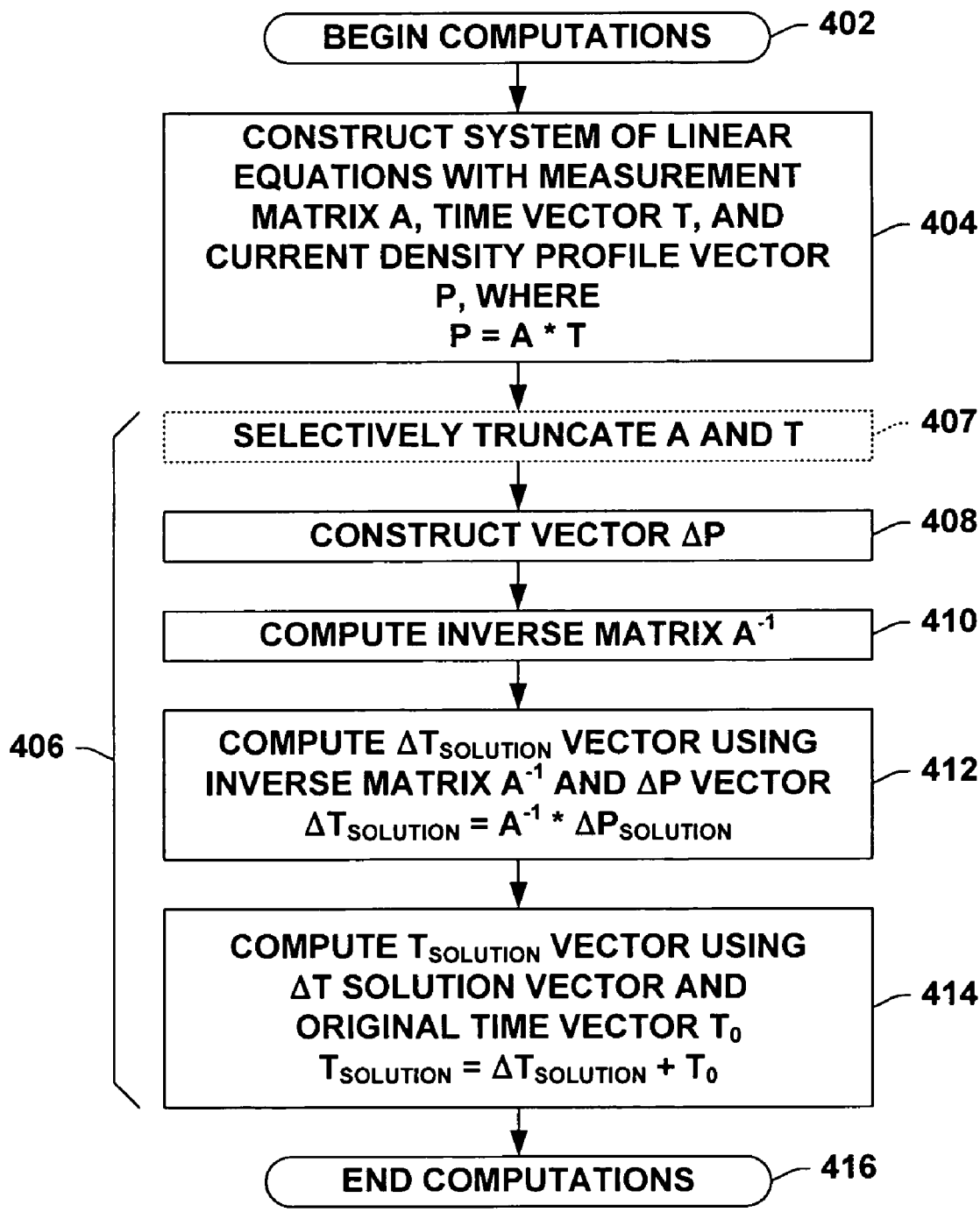
FIG. 5 is a flow diagram illustrating an exemplary computation sequence that may be employed in the method of FIG. 2 in accordance with the invention.

FIG. 2 illustrates an exemplary beam scanner calibration method 200 in accordance with one or more aspects of the present invention, in which measurements are taken and computations are performed to determine a set of scan times for constructing a piecewise linear scanner voltage waveform to improve implant uniformity and to reduce excess overscan in an ion implantation system. FIGS. 3A and 5 illustrate exemplary measurement and computation sequences, respectively, that may be employed in the method 200, as described further below. While the exemplary method 200 and the exemplary measurement and computation sequences are illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the implantation and scanner calibration systems which are illustrated and described herein as well as in association with other systems and devices not illustrated.

The method 200 begins at 202 in FIG. 2, wherein a plurality of initial current density profile measurements are taken at 300 at a plurality of locations along a scan direction, where the measured values individually correspond to one of a plurality of initial voltage scan intervals and to one of a corresponding plurality of initial scan time values. The measurements at 300 may be taken using any suitable dosimetry equipment or other measurement system, which may include one or multiple measurement sensors (e.g., dosimetry cups, etc.), wherein the measurements may be taken concurrently or individually in any order, wherein all such implementations are contemplated as falling within the scope of the invention and the appended claims. One exemplary measurement sequence 300 is illustrated and described further below with respect to FIG. 3A in accordance with the invention.

Computations are then performed at 400 in FIG. 2 to determine a set of scan time values according to the measured current density values obtained at 300. At 404, a system of linear equations is created based on the measured initial current density values and the initial scan time values. A set of scan time values is then determined at 406 for the voltage scan intervals, where the determined time values correspond to a solution to the system of linear equations that reduces current density profile deviations, and the method 200 ends at 204. The set of scan time values determined at 406 may then be used to create a beam scanner voltage waveform for use in implanting workpieces as illustrated and described further below with respect to FIG. 6G. Alternatively, one or more iterations may be undertaken to refine the set of time values determined at 406, which may, but need not involve redefining the number, size, or spacing of the voltage scan intervals.

Figure 3B:
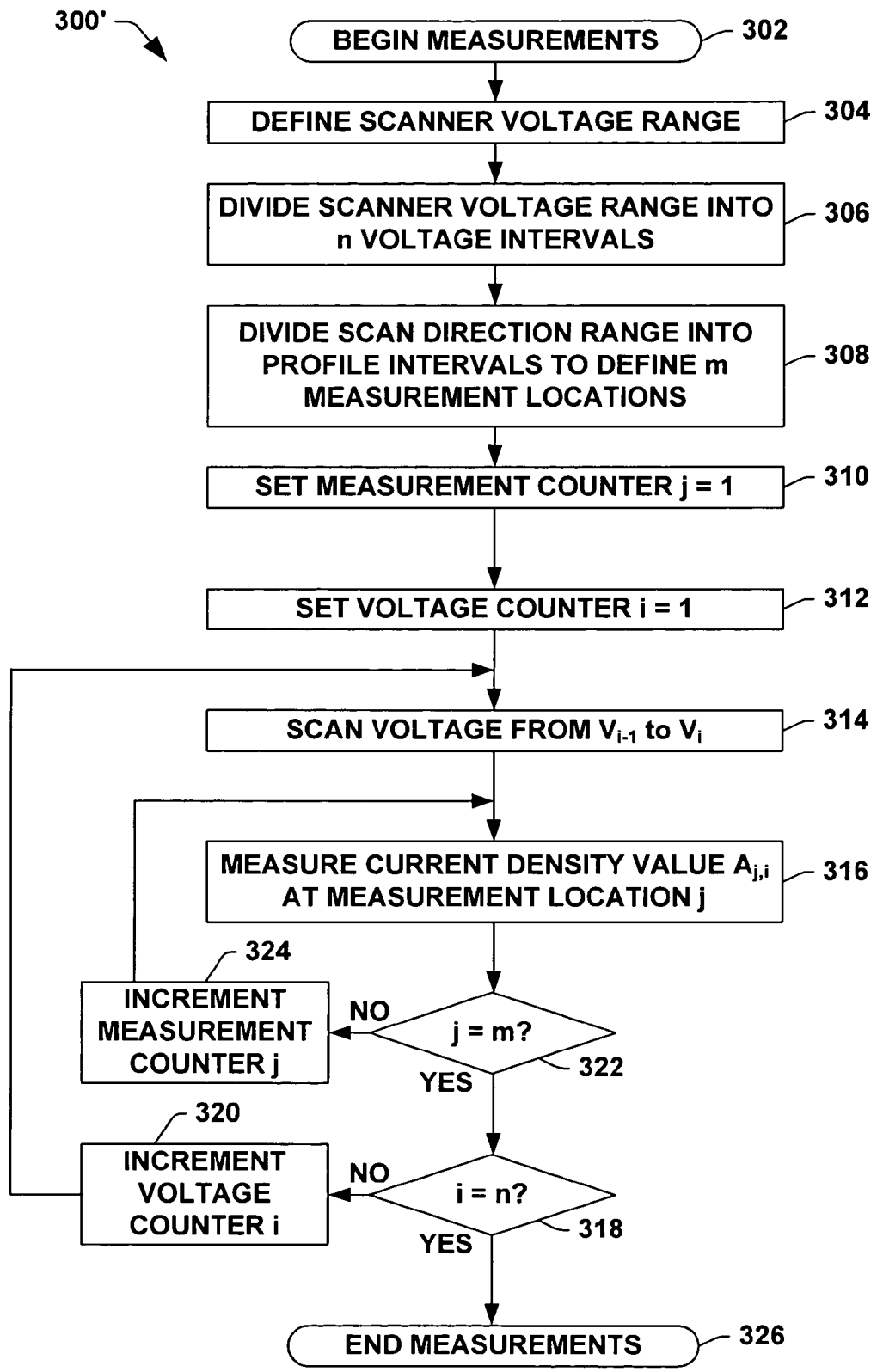
FIG. 3B is a flow diagram illustrating an exemplary measurement sequence that may be employed in the method of FIG. 2 in accordance with another aspect of the invention.
Figure 4A:
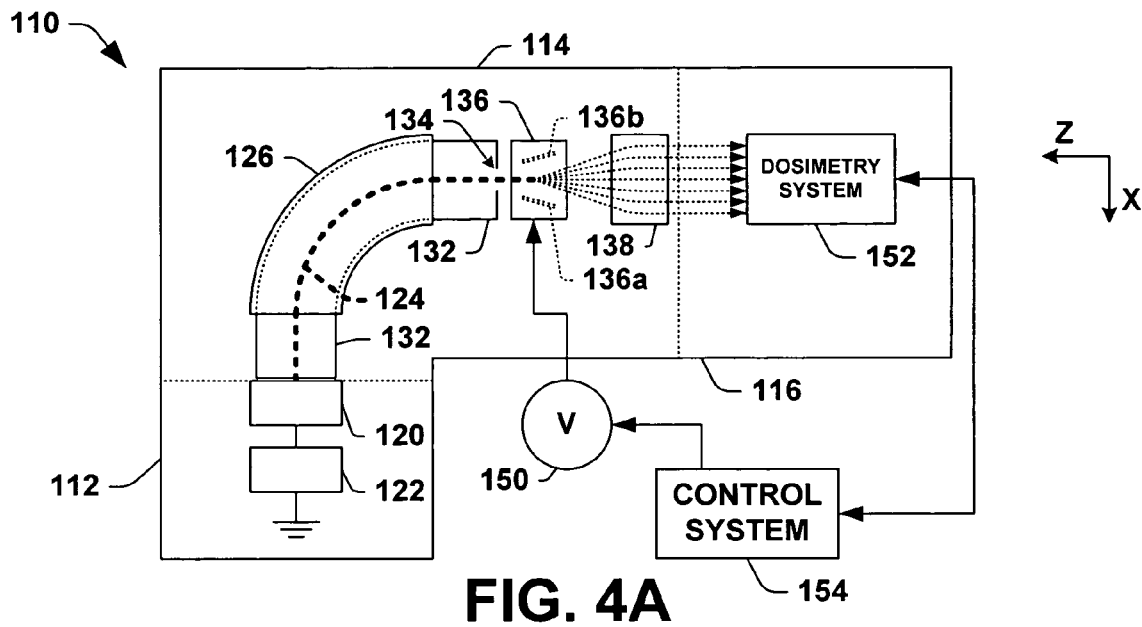
FIG. 4A is a schematic diagram illustrating an ion implantation system with a calibration system comprising a control system and a dosimetry system in accordance with the invention.
Figure 4B:
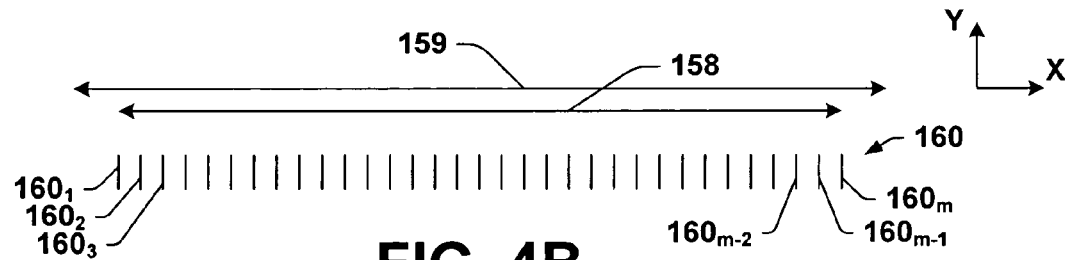
FIG. 4B is an end elevation view illustrating an exemplary plurality of profile point locations along a lateral beam scan direction at a workpiece location in the exemplary implantation system of FIG. 4A in accordance with the invention.
Figure 4C:
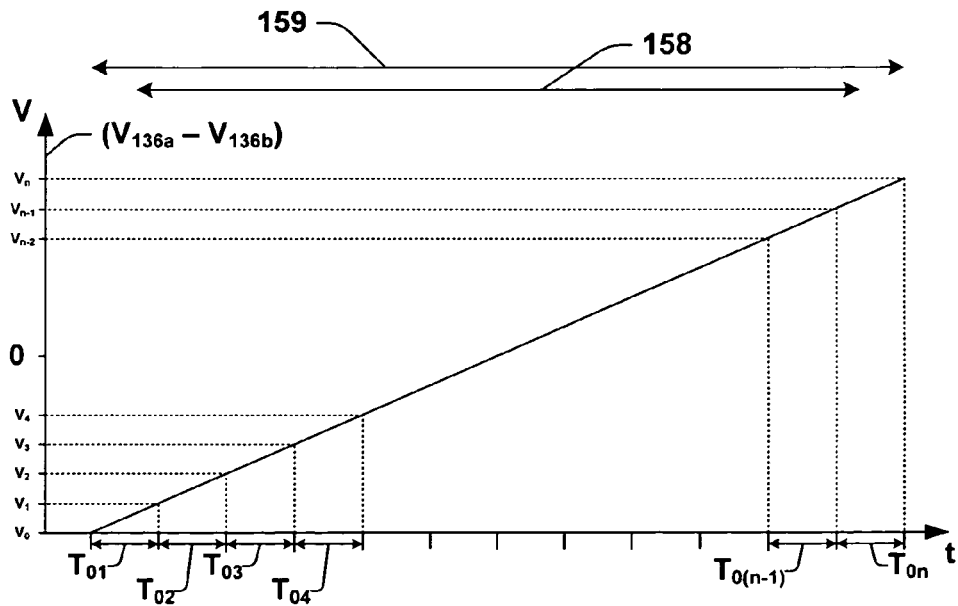
FIG. 4C is a graph illustrating partitioning of an initial triangular scanner voltage waveform into a plurality of initial voltage scan intervals with a plurality of corresponding scan time values in accordance with the invention.
Figure 4D:
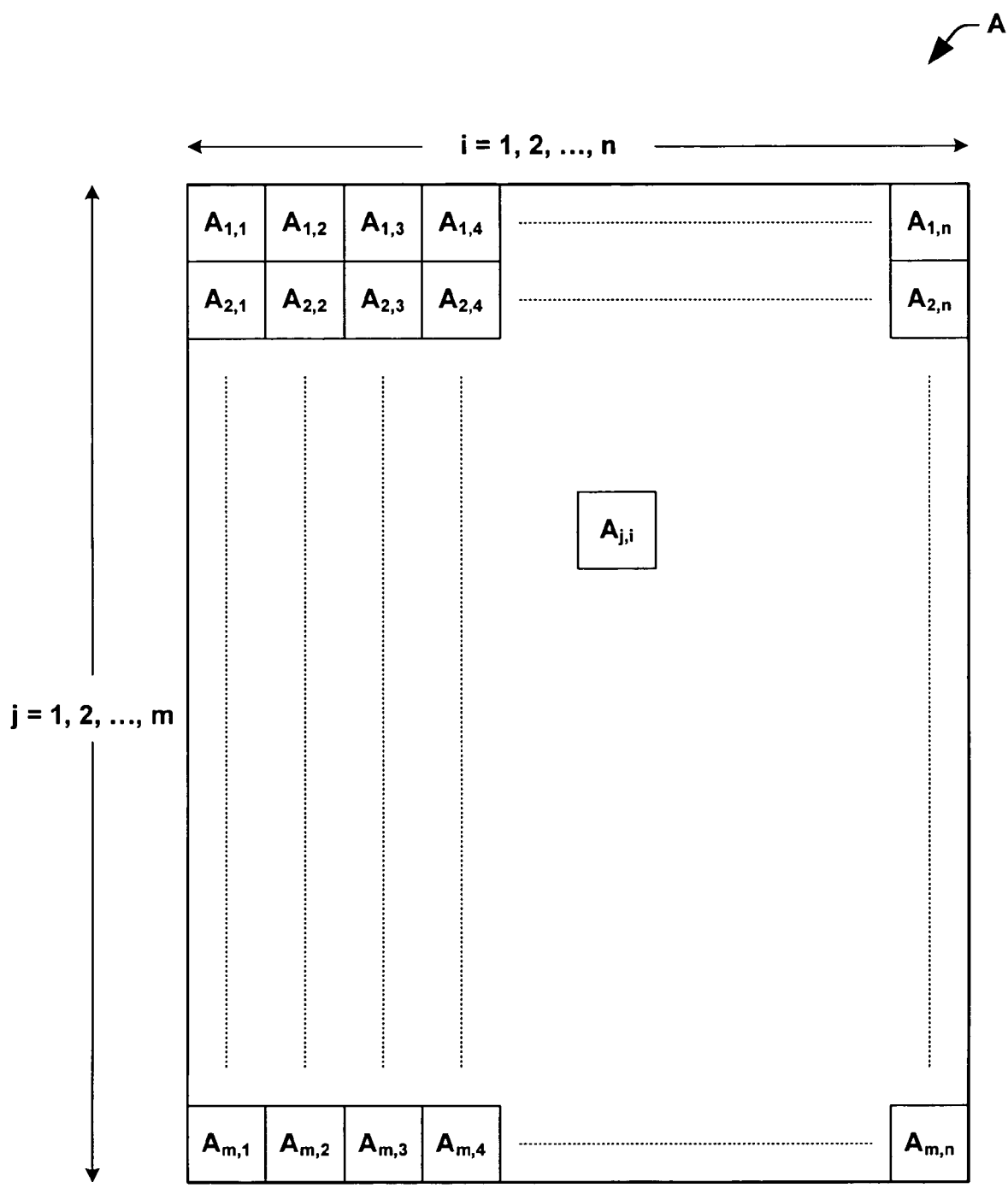
FIG. 4D is a schematic diagram illustrating an exemplary matrix of measured current density values in accordance with the invention.

Referring also to FIGS. 3A–4D, FIG. 3A illustrates one example of a measurement sequence 300 that may be employed in the method 200, FIG. 4A illustrates an ion implantation system 110 with a calibration system comprising a control system 154 and a dosimetry system 152 in accordance with the invention. In order to further illustrate the exemplary measurement technique 300 of FIG. 3A, FIG. 4B illustrates an exemplary plurality of profile point locations along a lateral beam scan direction at a workpiece location in the implantation system 110, FIG. 4C illustrates an initial triangular scanner voltage waveform segmented into a plurality of initial voltage scan intervals with a plurality of corresponding scan time values, and FIG. 4D illustrates a matrix of measured current density values in accordance with the invention.

As shown in FIG. 4A, the exemplary ion implantation system 110 is a low-energy ion implanter with no linear accelerator (linac) components. However, the invention may alternatively be employed in high or medium energy ion implanters, which may include acceleration components. The implantation system 110 comprises a terminal 112, a beamline assembly 114, and an end station 116, wherein an ion source 120 in the terminal 112 is powered by a power supply 122 to provide an extracted ion beam 124 to the beamline assembly 114, where the source 120 includes one or more extraction electrodes (not shown) to extract ions from the source chamber and thereby to provide the extracted ion beam 124 to the beamline assembly 114.

The beamline assembly 114 comprises a beamguide 132 having an entrance near the source 120 and an exit with an exit aperture 134, as well as a mass analyzer 126 that receives the extracted ion beam 124 and creates a dipole magnetic field to pass only ions of appropriate charge-to-mass ratio or range thereof (e.g., a mass analyzed ion beam 124 having ions of a desired mass range) through the resolving aperture 134 to a workpiece location in the end station 116. Various beam forming and shaping structures (not shown) may be provided in the beamline assembly to maintain the ion beam 124 and which bound an elongated interior cavity or passageway through which the beam 124 is transported along a beam path to the end station 116. The illustrated end station 116 is a "serial" type end station that supports a single workpiece (not shown) along the beam path for implantation (e.g., a semiconductor wafer, display panel, or other workpiece to be implanted with ions from the beam 124), wherein a dosimetry system 152 is situated at the workpiece location in FIG. 4A for calibration measurements prior to implantation operations.

The beamline assembly 114 further comprises a scanning system with a scanner 136 and a power supply 150 coupled to scanner plates or electrodes 136a and 136b, where the scanner 136 receives a mass analyzed ion beam 124 along the beam path from the mass analyzer 126 and provides a scanned beam 124 along the beam path to a parallelizer 138. The parallelizer 138 then directs the scanned beam 124 to the end station 116 such that the beam 124 strikes measurement sensor(s) of the dosimetry system 152 at a generally constant angle of incidence. The scanner 136 receives a mass analyzed ion beam 124 having a relatively narrow profile (e.g., a "pencil" beam in the illustrated system 110), and a voltage waveform applied by the power supply 150 to the scanner plates 136a and 136b operates to scan the beam 124 back and forth in the X direction (the scan direction) to spread the beam 124 out into an elongated "ribbon" profile (e.g., a scanned beam 124), having an effective X direction width that may be at least as wide as or wider than the workpieces of interest. The scanned beam 124 is then passed through the parallelizer 138 that directs the beam toward the workpiece 130 generally parallel to the Z direction (e.g., generally perpendicular to the workpiece surface).

Referring also to FIG. 4B, the dosimetry system 152 comprises one or more current density sensors (not shown), such as multiple conventional Faraday cups located at predetermined locations 160 along the scan direction, or a single sensor which may be positioned at the various locations 160 for successive measurements of the amount of ions (current density) imparted by a scanned ion beam 124 at a given location 160. U.S. Pat. No. 6,677,598, assigned to the assignee of the present invention, illustrates measurement apparatus that may be employed in measuring current density values in accordance with the present invention, the entirety of which is hereby incorporated by reference as if fully set forth herein. The dosimetry system 152 is operatively coupled to the control system 154 to receive command signals therefrom and to provide measurement values thereto to implement the measurement aspects of the calibration techniques of the invention as described further hereinafter.

During initial setup or calibration of the system 110, the dosimetry system 152 is positioned at the workpiece location of the end station 116, as shown in FIG. 4A, and a workpiece width dimension 158 is partitioned in FIG. 4B into an initial set of profile intervals, within which an integer number m measurement locations (profile points) 160 are determined for initial measurement of current density values during scanning of the ion beam 124. In the illustrated example, the locations 160 along the scan direction are spaced from one another by a profile interval distance that is less than a lateral dimension of an ion beam 124, although other spacings are possible. In addition, the exemplary selection of the measurement locations 160 in FIG. 4B provides for generally even spacing, although the profile intervals need not be of equal lateral dimensions.

Referring also to FIG. 4C, an initial voltage scan range 159 is selected, which provides some measure of beam overscan beyond the ends of the workpiece width 158 (e.g., the scan range 159 is sufficiently wide to cause the scanned ion beam 124 to extend past the lateral edges of the workpiece). The voltage scan range 159 is divided into an integer number n voltage intervals, as shown in FIG. 4C, wherein each interval extends between a first voltage $V_{i-1}$ to a second voltage $V_i$ for i=1 through n. FIG. 4C illustrates an initial triangle waveform for the scanner voltage ($V_{136a}$–$V_{136b}$), wherein the exemplary scan voltage intervals $V_{i-1}$ to $V_i$ are equal, and wherein a corresponding set of n initial scan time values $T_{01}$, $T_{02}$, . . . , $T_{0n}$ are equal. Any initial range selection 159 and segmentation of the range 159 is possible within the scope of the invention, wherein the voltage intervals $V_{i-1}$ to $V_i$ need not be equal and the scan time values $T_{0i}$ need not be equal. Furthermore, as discussed below, the intervals may be changed or redefined following an initial measurement (e.g., to reduce excess overscan and/or to improve uniformity), and the time values used in implanting workpieces in the system 110 are determined or solved according to computations following the initial measurements (e.g., so as to improve implant uniformity) in accordance with the present invention.

In a measurement operation during system calibration, the control system 152 of FIG. 4A controls the voltage of the power supply 150 such that the scanner voltage (e.g., the voltage difference between the scanner plates 136a and 136b) varies linearly between the voltage interval endpoints over the initial scan time values, and the dosimetry system 152 takes corresponding current density measurements to construct a matrix A, as shown in FIG. 4D. The control system 154 then performs various computations (e.g., at 404 and 406 in the method 200 of FIG. 2 above) to determine a set of scan time values that correspond to a solution to the system of linear equations that reduces current density profile deviations. The dosimetry system 152 is then removed from the workpiece location and the determined set of scan time values may then be used to create a beam scanner voltage waveform for workpiece implantation, for example, as shown in FIG. 6G below.

Referring to FIG. 3A, the exemplary measurement sequence 300 of the method 200 is hereinafter described with respect to an implementation using the calibration system 152, 154 in the implanter 110 of FIG. 4A, the initial measurement locations 160 of FIG. 4B, and the initial voltage range segmentation of FIG. 4C. The measurements 300 begin at 302, with the voltage span being defined at 304 (e.g., the initial scanner voltage range 159 of FIGS. 4B and 4C, which extends beyond the voltages associated with the lateral edges of the workpiece width 158 to provide some amount of initial overscan). The voltage range 159 is then divided or segmented at 306 into an integer number n voltage intervals (a plurality of n intervals $V_{i-1}$ to $V_i$ for i=1 through n as shown in FIG. 4C). The partitioning of the voltage range 159 at 306 and the assumed initial triangular scan waveform of FIG. 4C define the corresponding set of n initial scan time values $T_{01}$ through $T_{0n}$, which are equal, and which together form a vector $T_0$ of dimension n. However, any initial scan waveform may be used, wherein the voltage partitioning and the waveform selection define the initial set of time values $T_0$ used in the measurements 300, wherein the initial time entries of the vector $T_0$ need not be equal. The lateral scan direction range (e.g., the workpiece width 158 in FIGS. 4B and 4C) is then divided into multiple profile intervals, thereby defining an integer number m measurement locations along the scan direction (e.g., the locations $160_1$ through $160_m$ in FIG. 4B).

With the initial segmentation of the measurement range 158 and the voltage range 159, the control system 154 provides appropriate control signals to the power supply 150 to cause the scanner 136 to scan an ion beam 124 across the workpiece location in the scan direction X one or more times according to the n initial voltage scan intervals ($V_{i-1}$ to $V_i$ for i=1 through n) and the corresponding n scan time values ($T_0$), and also controls the dosimetry system 152 to measure a plurality of initial current density values $A_{j,i}$ at the locations 160, where the initial current density values $A_{j,i}$ individually correspond to one of the n voltage intervals ($V_{i-1}$ to $V_i$) and the corresponding scan time value $T_{0i}$. In this regard, the illustrated measurement sequence 300 of FIG. 3A is shown for the case of a single measurement sensor in the dosimetry system 152 that is moved from location to location, wherein the beam 124 is scanned an integer number m times. However, fewer beam scans may be needed where the dosimetry system 152 includes multiple sensors, for example, where a single calibration measurement scan may be used if m sensors are provided at the locations 160.

For the single sensor case in FIG. 3A, a measurement counter j is set to a value of 1 at 310, and a voltage scan interval counter i is set to a value of 1 at 312. The calibration system 152, 154 then obtains a first current density value $A_{j,i}$ at 314, 316 representing the first entry in to the matrix A of FIG. 4D. For this first value $A_{j,i}$, the control system 154 directs the power supply 150 at 314 to scan the voltage (e.g., ($V_{136a}$–$V_{136b}$)) linearly from $V_{i-1}$ to $V_i$ over the corresponding initial scan interval time $T_{0i}$, and also directs the dosimetry system 152 to measure the resultant current density $A_{j,i}$ at 316 at the measurement location j (e.g., at location $160_1$ in FIG. 4B). This first measurement $A_{1,1}$ represents the current density contribution at the first location $160_1$ resulting from scanning the beam 124 from $V_0$ to $V_1$ over the time $T_{01}$, and is placed in the first row, first column position in the matrix A of FIG. 4D.

A determination is made at 318 as to whether i=n (e.g., whether the entire voltage scan range 159 has been scanned). If not (NO at 318), the measurement sequence 300 proceeds to 320 where the voltage counter i is incremented. Thereafter, the scanner voltage is scanned across the next scan interval at 314 with i=2 (e.g., from $V_1$ to $V_2$ over the second initial time value $T_{02}$), and another measurement is taken at 316. This second value $A_{1,2}$ is placed in the first row, second column position of the matrix A, representing the current density contribution at the first location $160_1$ resulting from scanning the beam 124 from $V_1$ to $V_2$ over the time $T_{02}$.

Interval scanning and single position measurements continue in this fashion (at 314, 316, 318, and 320) until i=n (e.g., at which point the first row of the matrix A in FIG. 4D has been filled with values measured at the first profile location $160_1$, which individually reflect the current density contributions at the location $160_1$ corresponding to scanning the beam 124 through one of the n initial voltage scan intervals $V_{i-1}$ to $V_i$ over the corresponding initial time value $T_{0i}$. It is noted at this point that the summation of the values $A_{1,j}$ represents the total current density seen at the location $160_1$ resulting from scanning the beam 124 across the entire voltage scan range 159. This summation is therefore a better measure of the amount of ions implanted at the location $160_1$ during actual implantation than was the measurement obtained using the conventional point-by-point technique, in which the measurement at a given point was taken only for current density resulting from the time when the beam was at that point.

When i becomes equal to n in FIG. 3A (YES at 318), a determination is made at 322 as to whether the measurement counter j is equal to m. If not (NO at 322), the measurement counter j is incremented at 324, and the process 300 returns to again set the voltage counter i to a value of 1. In the case of a single measurement sensor in the dosimetry system 152, the sensor would be moved at this time to the next location $160_j$. Thus, for example, when j is incremented at 324 after measurements at the first location $160_1$, the dosimetry system 152 is then configured to take measurements at the second location 1602. With i=1 and j=2, the process 300 proceeds to 314 and 316, wherein the voltage is scanned at 314 from $V_0$ to $V_1$ over the corresponding time $T_{01}$, and a current density value $A_{2,1}$ is measured at 316 and placed in the second row, first column position of the matrix A, representing the current density contribution at the second location $160_2$ resulting from scanning the beam 124 from $V_0$ to $V_1$ over the time $T_{01}$. The process 300 is then repeated in this fashion until the counter j=m (YES at 322), indicating that the m rows of the matrix A have been filled, and the measurements 300 end at 326 in FIG. 3A.

Referring to FIG. 4D, the exemplary measurement sequence 300 of FIG. 3A provides for m scans of the beam 124 across the voltage range 150 (FIG. 4C) to obtain n x m measurements $A_{j,i}$, using a single sensor in the dosimetry system 152, wherein the matrix A is filled on a row-by-row basis. Alternatively, if m sensors are provided and positioned at the locations $160_1$–$160_m$ in FIG. 4B, a single scan of the beam 124 may be used, where the scanner voltage ($V_{136a}$–$V_{136b}$) may be transitioned linearly from $V_0$ through $V_n$ according to the time values $T_{01}$ through Ton, with the dosimetry system 152 obtaining m measurement values $A_{j,i}$ during each time interval $T_{0i}$, wherein a column of the matrix A is filled at the conclusion of each time value $T_{0i}$. Any suitable measurement approach may be employed at 300 within the scope of the invention, by which the matrix A is filled with the corresponding entry values $A_{j,i}$, or otherwise by which a set of linear equations may be derived based on measured current density values $A_{j,i}$ that individually corresponding to one of a plurality of initial voltage scan intervals $V_{i-1}$ to $V_i$ and one of a corresponding plurality of initial scan time values $T_{0i}$.

In an alternative aspect of the present invention, the data may be collected in accordance with the method 300' of FIG. 3B, wherein for each scan voltage interval i, an entire profile measurement is taken (e.g., wherein j is incremented from 1 to m). For example, as illustrated in FIG. 3B, for a give scan voltage interval I (set at 312 or 320, the current density is measured across the entire measurement range at 316, 322 and 324. When j=m (YES at 322), the measurements have been taken across the entire measurement range, and the scan voltage interval is incremented in accordance with 318, 320 and the next scan voltage interval takes place at 314, wherein current density is again measured across the entire measurement range at 316, 322 and 324. The process then continues until the entire scan interval range has been traversed (YES at 318), wherein the measurement method 300' concludes at 326.

Referring now to FIGS. 2, 4A, and 5–6G, the control system 154 is further operable to create a system of linear equations based on the measured initial current density values $A_{j,i}$ and the initial scan time values $T_{0i}$, and to determine a set of scan time values $T_{SOLUTION}$ for the voltage scan intervals $V_{i-1}$ to $V_i$, where the values $T_{SOLUTION}$ correspond to a solution to the system of linear equations that reduces current density profile deviations. This set of interval scan times $T_{SOLUTION}$ may then be employed by the control system 154 to create a scanner voltage waveform during implantation of workpieces in the system 110. Moreover, the control system may determine the vector of solution time values $T_{SOLUTION}$ based on the full set of equations according to the full matrix A of FIG. 4D, or may selectively truncate the matrix A and the time value vector T if one or more columns of the matrix A are all zero values (e.g., no non-zero values), as illustrated and described below with respect to FIGS. 7A and 7B. Furthermore, one or more iterations may be employed after obtaining the initial matrix A, for example, wherein the definitions of the voltage scan intervals $V_{i-1}$ to $V_i$ and/or the set of locations $160_j$ are refined, where the numbers (n, m) of these may be adjusted as well, wherein all such variant implementations are contemplated as falling within the scope of the present invention and the appended claims.

Figure 6D:
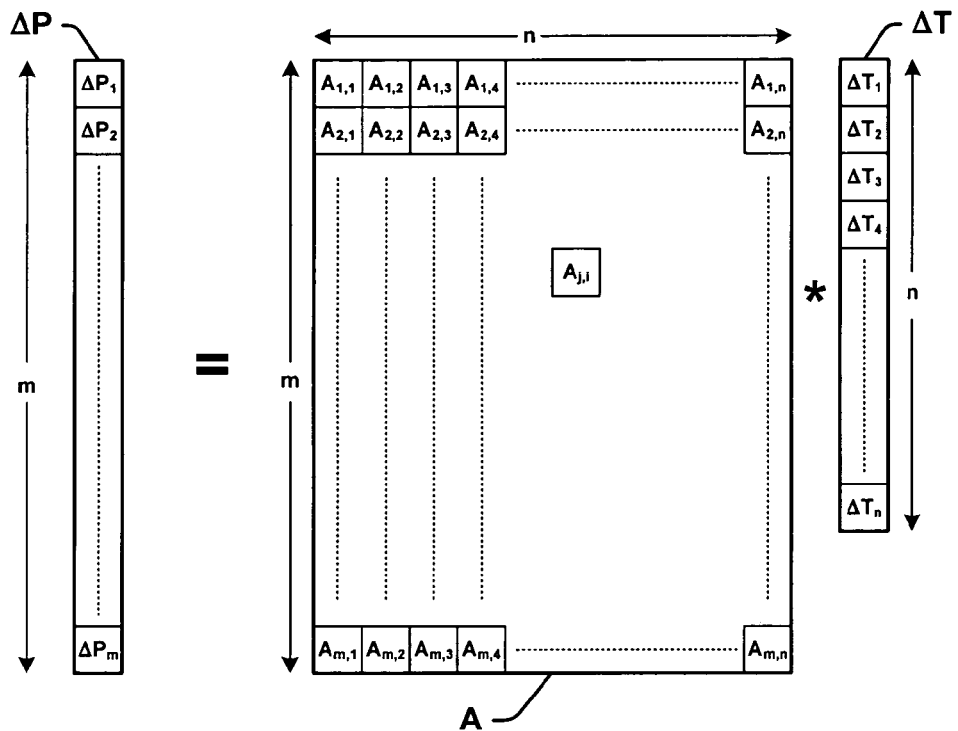
FIG. 6D is a schematic diagram illustrating an exemplary set of linear equations relating the profile deviation vector of FIG. 6B to the time deviation vector of FIG. 6C using the matrix of FIG. 4D.
Figure 6E:
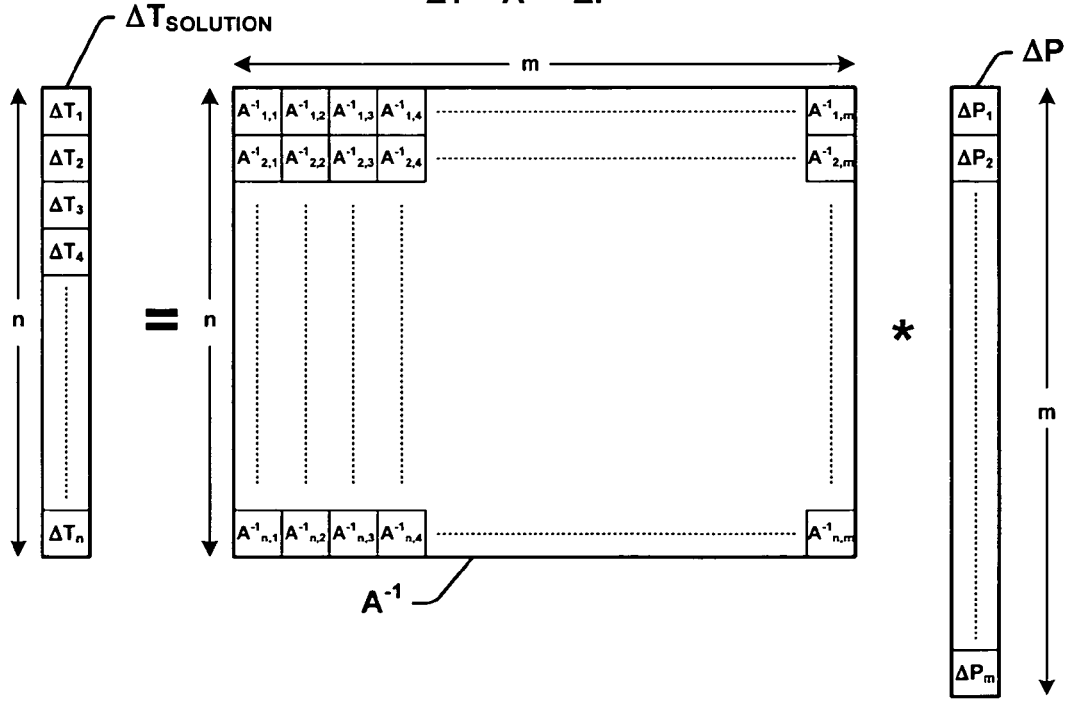
FIG. 6E is a schematic diagram illustrating a solution to the set of equations of FIG. 6D relating a time deviation solution vector to the profile deviation vector of FIG. 6B using an inverse of the matrix of FIG. 4D in accordance with the invention.
Figure 6F:
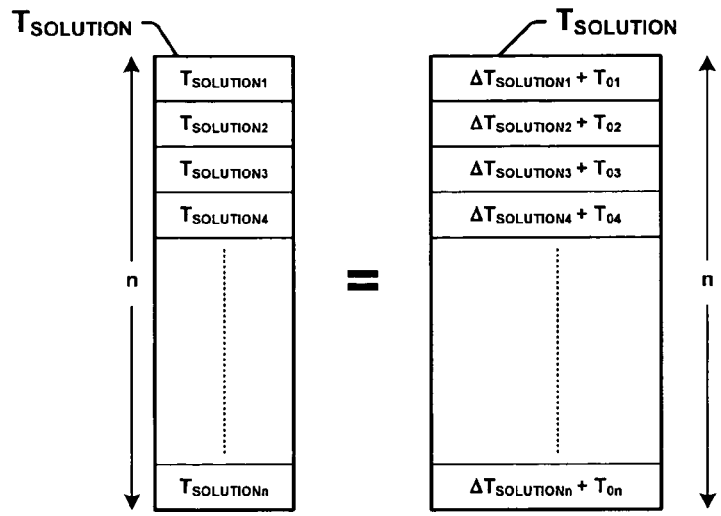
FIG. 6F is a schematic diagram illustrating computation of an exemplary scan time solution vector comprising the set of scan time values corresponding to the solution to the system of linear equations that reduces current density profile deviations in accordance with the invention.
Figure 6G:
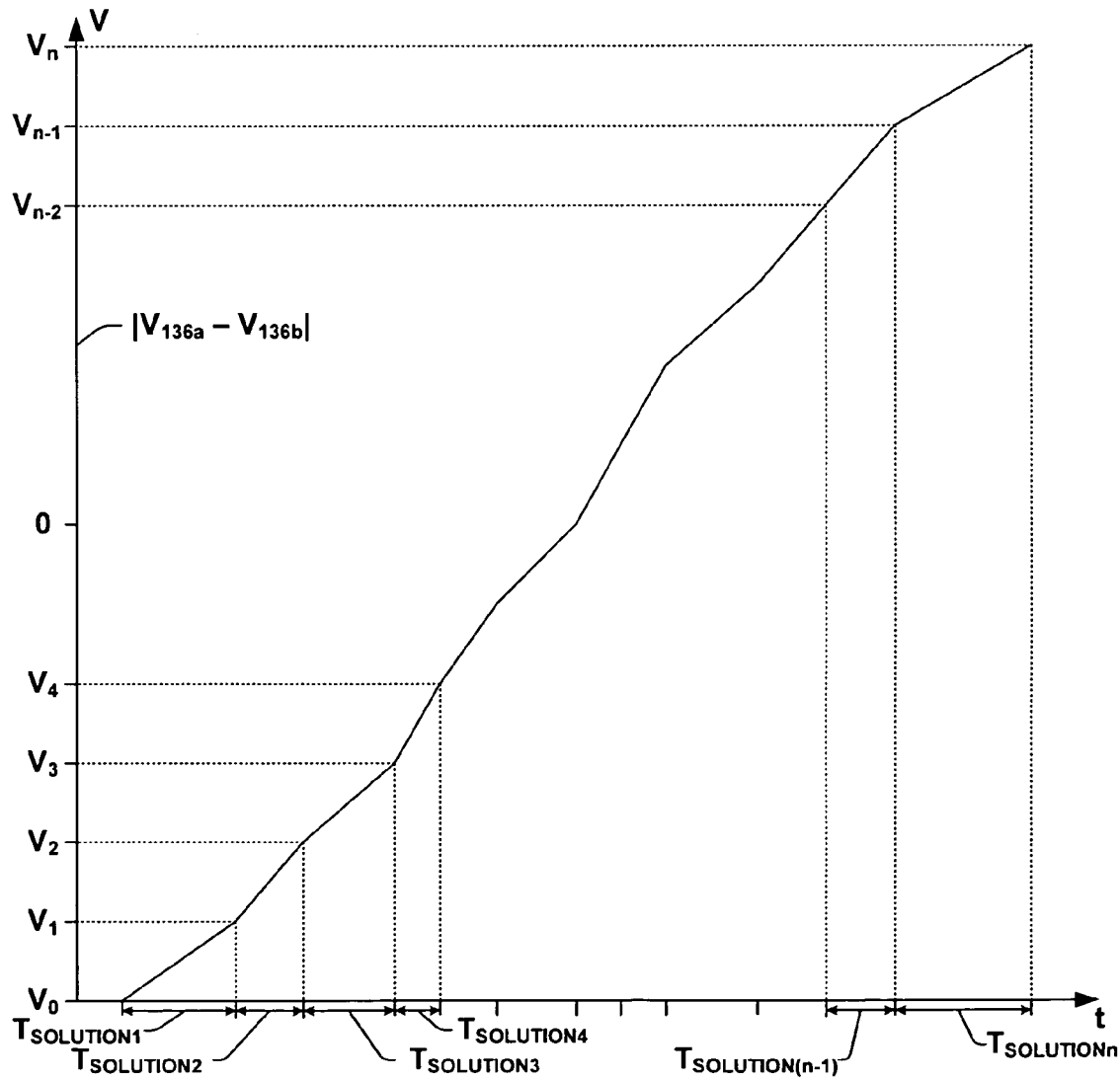
FIG. 6G is a graph illustrating an exemplary piecewise linear calibrated scanner voltage waveform created using the initially defined scan voltage intervals and the computed scan time solution vector of FIG. 6F to improve implant uniformity in accordance with the invention.

FIG. 5 illustrates one possible implementation of the computations 400 in the method 200 of FIG. 2 above, and FIGS. 6A–6G illustrate the various corresponding mathematical computations and matrix equations, as well as a resulting voltage scan waveform. The exemplary computations 400 begin at 402 in FIG. 5, wherein a system of linear equations is constructed at 404 using the measurement matrix A of FIG. 4D, the corresponding initial time value vector $T_0$, and a current density profile vector P, where P=A*T in matrix notation. As illustrated in FIG. 6A, the set of linear equations are constructed as an initial profile vector $P_0$ of vertical dimension m being equal to the matrix A (m×n) times the initial time vector $T_0$ of dimension n. This equation set includes m individual equations with n unknowns, where m is preferably larger than n. Each individual equation characterizes the cumulative current density contribution at the corresponding measurement location 160 with the scanning of the beam 124 through the voltage scan intervals according to the interval times $T_0$.

The control system 154 then determines a set of scan time values at 406 for the voltage scan intervals, where the determined time values correspond to a solution to the system of linear equations that reduces current density profile deviations. In this regard, the set of equations may be solved using any suitable techniques, including but not limited to the computations illustrated and described hereinafter.

At 407 in FIG. 5, the matrix A and the vector T may be selectively truncated to eliminate zero matrix columns and the corresponding time entries, as illustrated and described below with respect to FIGS. 7A and 7B.

After any such truncation, the computations 400 proceed to 408, where a deviation vector $\Delta P$ is constructed for the profiles and scan times, respectively. As shown in FIG. 6B, a profile average value $P_{AVG}$ is computed from the profile vector $P_0$ as the average of the m initial profile values, wherein $P_{AVG}=(1/m)*(P_{01}+P_{02}+\ldots+P_{0m})$, and a profile deviation vector $\Delta P$ is computed, which comprises m profile deviation values, wherein $\Delta P_j = P_{0j} - P_{AVG}$ for j=1 through m. The resulting profile deviation vector $\Delta P$ thus represents the deviation of the current density at each measurement location 160 from the average current density across the entire profile $P_0$. As illustrated in FIG. 6C, a time value deviation vector $\Delta T$ is then defined, wherein the entries $\Delta T_i$ thereof represent the difference between a corresponding solution set value $T_{SOLUTIONi}$ and the initial value $T_{0i}$ (e.g., $\Delta T_i = T_{SOLUTIONi} - T_{0i}$, for i-1 through n).

Referring also to FIGS. 6D and 6E, the equations may be restated in terms of the deviation vectors $\Delta P$ and $\Delta T$, wherein $\Delta P = A * \Delta T$. In this regard, it is noted that it is desirable to minimize deviations in the current density profile across an implanted workpiece. The expression of FIG. 6D in terms of the deviation vectors $\Delta P$ and $\Delta T$ allows the equations to be solved for a solution set of time values that will optimize uniformity by minimizing the profile deviations, wherein the expression of FIG. 6D may be solved for the time value deviation vector $\Delta T$, for example, by inverting the matrix A and multiplying the inverse $A^{-1}$ by the profile deviation vector $\Delta P$, as illustrated in FIG. 6E, wherein $\Delta T = A^{-1} * \Delta P$.

At 410, an inverse matrix is computed from the initial matrix A, where the inverse $A^{-1}$ may be computed using any suitable techniques. For example, if m>n, the system of equations is over determined, and the inverse matrix $A^{-1}$ may be computed using singular value decomposition (SVD). Other techniques are available, particularly if m=n. However, it is noted that the voltage scan intervals and the profile intervals (measurement locations 160) can be defined independent of one another, wherein it may be preferable to include a large number of measurement locations 160 to provide a better optimization, with relatively few voltage scan segments to facilitate timely calibration.

At 412 in FIG. 5, a time deviation solution vector $\Delta T_{SOLUTION}$ is computed (e.g., the set of equations is solved) by multiplying the inverse matrix $A_{-1}$ and the profile deviation vector $\Delta P$ to obtain the deviation solution vector $\Delta T_{SOLUTION}$ comprising n scan time deviation values, wherein $\Delta T_{SOLUTION} = A^{-1} * \Delta P$, as shown in FIG. 6E. Because the scan time deviation vector $\Delta T$ was defined in FIG. 6C as $\Delta T = T_{SOLUTION} - T_0$, a scan time solution vector $T_{SOLUTION}$ is then computed at 414 by adding the scan time deviation vector $\Delta T_{SOLUTION}$ and the initial scan time vector $T_0$, where the scan time solution vector $T_{SOLUTION}$ comprises the set of scan time values corresponding to the solution to the system of linear equations that reduces current density profile deviations, and wherein $T_{SOLUTION} = \Delta T_{SOLUTION} + T_0$, as illustrated in FIG. 6F, after which the computations 400 end at 416.

Referring also to FIG. 6G, the solution set of scan time values $T_{SOLUTION}$ may then be used to create a piecewise linear beam scanner voltage waveform for use in implanting workpieces. In operation of the system 110 (FIG. 4A) to implant workpieces, the control system 154 controls the power supply 150 to provide the waveform of FIG. 6G, wherein the scanner plate voltage $(V_{136a} - V_{136b})$ transition linearly in each voltage interval (e.g., from $V_{i-1}$ to $V_i$) in the time $T_{SOLUTIONi}$ for each fast scan across the lateral scan direction (the X direction), as the workpiece is translated along the slow scan direction (the Y direction), to achieve scanning of the workpiece surface, where the employment of the solution set of time values $T_{SOLUTION}$ provides the best fit to achieve proper implant uniformity.

Figure 7A:
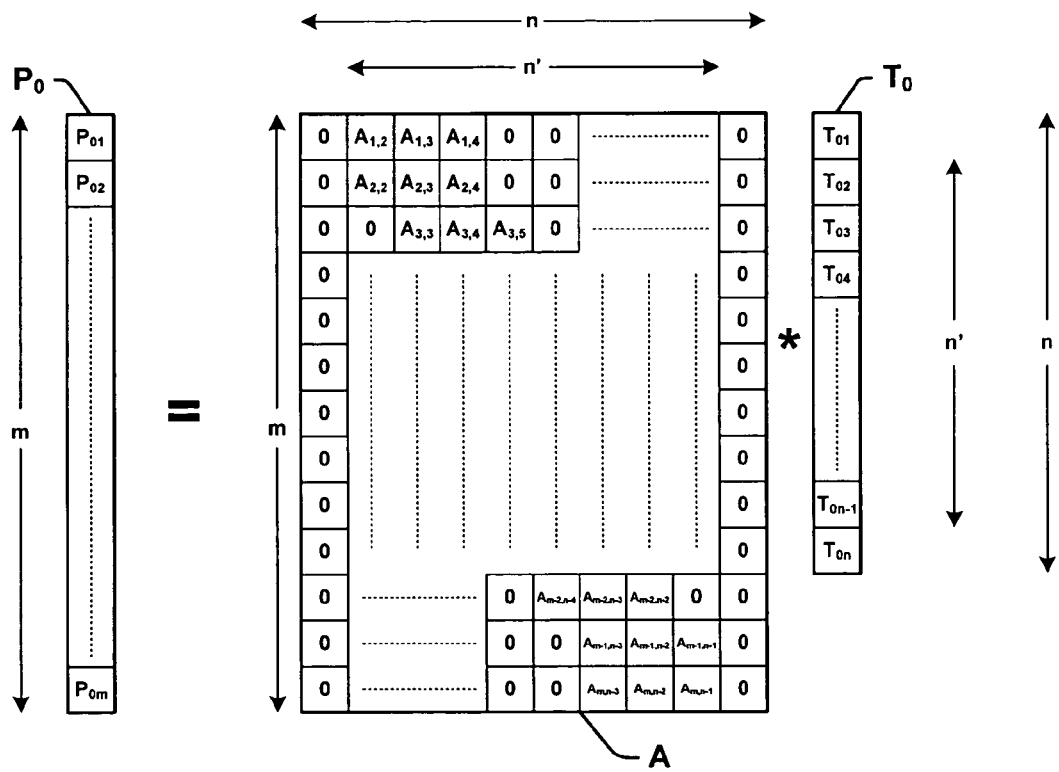
FIGS. 7A and 7B are schematic diagrams illustrating selective truncation of the matrix and scan time vector to eliminate excess overscan in accordance with the present invention.
Figure 7B:
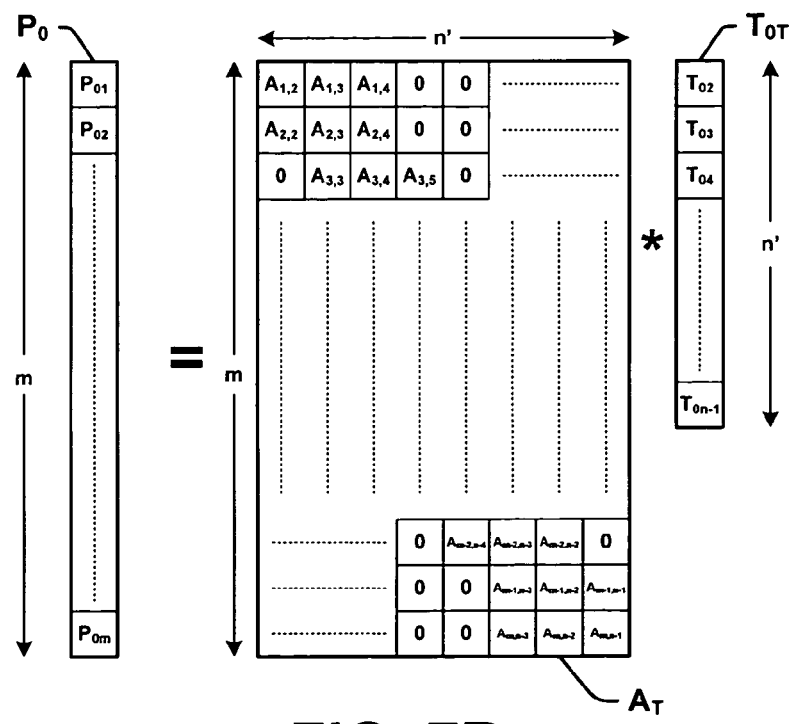

Referring now to FIGS. 4A, 4B, 7A, and 7B, as discussed above, another aspect of the invention facilitates improved system scan efficiency by eliminating unnecessary overscan of the beam 124 past the edges of the workpiece during implantation. In this regard, it is noted that the initial voltage scan range 159 of FIGS. 4B and 4C was selected to provides some degree of beam overscan beyond the ends of the workpiece width 158. If one or more voltage scan intervals of this wide initial scan range 159 do not contribute any current density to any of the profile intervals as measured at the locations 160, the corresponding column or columns in the matrix A will have no non-zero entries as shown in the example of FIG. 7A, thus indicating that there is no need to scan the beam 124 in those voltage intervals.

Accordingly, such superfluous columns can be truncated from the matrix A, and the corresponding time entries in the initial time vector $T_0$ can be truncated (e.g., at 407 in FIG. 5). This selective truncation, if performed, leaves a truncated matrix $A_T$ having m rows corresponding to the m locations along the scan direction and n' columns corresponding to the n' remaining initial voltage scan intervals and time values, as well as a corresponding truncated time vector $T_{0T}$ of length n', wherein n' is less than n, as illustrated in FIG. 7B. It is noted that this truncation effectively reduces the spatial range across which the beam 124 is scanned in subsequent implantation operations, thereby saving time and improving system scan efficiency.

In this case, the initial profile vector $P_0$ is computed as $P_0 = A_T * T_{0T}$ for use in computing $P_{AVG}$ and the profile deviation vector $\Delta P$ (FIG. 6B above). In addition, the inverse matrix $A_T^{-1}$ is computed from the truncated matrix $A_T$, and is then multiplied by the profile deviation vector $\Delta P$ to obtain a time deviation solution vector $\Delta T_{SOLUTION}$ comprising n' scan time deviation values, wherein $\Delta T_{SOLUTION} = A_T^{-1} * \Delta P$ (FIG. 6E above). Thereafter, the scan time solution vector $T_{SOLUTION}$ is determined as the sum of the time deviation solution vector $\Delta T_{SOLUTION}$ and the truncated initial time vector $T_{0T}$, where $T_{SOLUTION}$ will include n' values.

Alternatively, the voltage scan intervals may be redefined to include the original number n intervals spread out over a smaller range to exclude the unneeded overscan, and the calibration process may be repeated. Other iterative approaches may be employed as well, such as redefining the measurement locations (profile intervals) to include more measurements in areas experiencing the largest deviations, or according to other criteria, wherein all such alternative approaches are contemplated as falling within the scope of the invention and the appended claims.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for calibrating an ion beam scanner in an ion implantation system, the method comprising:
   measuring a plurality of initial current density values at a plurality of locations along a scan direction, the initial current density values individually corresponding to one of a plurality of initial voltage scan intervals and one of a corresponding plurality of initial scan time values;
   creating a system of linear equations based on the measured initial current density values and the initial scan time values; and
   determining a set of scan time values for the voltage scan intervals corresponding to a solution to the system of linear equations that reduces current density profile deviations.

2. The method of claim 1, wherein the initial current density values are measured at an integer number m locations, wherein the individual current density values correspond to one of an integer number n initial voltage scan intervals, and wherein m is greater than n.

3. The method of claim 2, wherein the m locations and the n initial voltage scan intervals do not correspond with one another.

4. The method of claim 2, wherein creating the system of linear equations comprises:
   forming a matrix A of the measured initial current density values with m rows corresponding to the m locations along the scan direction and n columns corresponding to the n initial voltage scan intervals and time values;
   forming an initial time vector $T_0$ comprising the n initial scan time values; and
   computing an initial profile vector $P_0$ comprising m initial current density profile values, wherein the initial profile vector $P_0 = A*T_0$.

5. The method of claim 4, wherein determining a set of scan time values comprises:
   computing a profile average value $P_{AVG}$ as the average of the m initial profile values, wherein $P_{AVG}=(1/m)*(P_{01}+P_{02}+\ldots+P_{0m})$;
   computing a profile deviation vector $\Delta P$ comprising m profile deviation values, wherein $\Delta P_j = P_{0j} - P_{AVG}$ for $j=1$ through m;
   computing an inverse matrix $A^{-1}$;
   multiplying the inverse matrix $A^{-1}$ and the profile deviation vector $\Delta P$ to obtain a time deviation solution vector $\Delta T_{SOLUTION}$ comprising n scan time deviation values, wherein $\Delta T_{SOLUTION} = A^{-1}*\Delta P$; and
   computing a scan time solution vector $T_{SOLUTION}$ as the sum of the time deviation solution vector $\Delta T_{SOLUTION}$ and the initial time vector $T_0$, the scan time solution vector $T_{SOLUTION}$ comprising the set of scan time values corresponding to the solution to the system of linear equations that reduces current density profile deviations, wherein $T_{SOLUTION} = \Delta T_{SOLUTION} + T_0$.

6. The method of claim 5, wherein the inverse matrix $A^{-1}$ is computed using singular value decomposition (SVD).

7. The method of claim 6, further comprising:
   selectively truncating the matrix A by eliminating one or more columns having no non-zero entries to form a truncated matrix $A_T$ having m rows corresponding to the m locations along the scan direction and n' columns corresponding to the n' remaining initial voltage scan intervals and time values, wherein n' is less than n; and
   selectively truncating the initial time vector $T_0$ to form a truncated initial time vector $T_{0T}$ comprising n' initial scan time values;
   wherein the initial profile vector $P_0$ is computed as $P_0 = A_T*T_{0T}$; and
   wherein determining the set of scan time values comprises:
   computing the profile average value $P_{AVG}$ as the average of the m initial profile values, wherein $P_{AVG}=(1/m)*(P_{01}+P_{02}+\ldots+P_{0m})$;
   computing a profile deviation vector $\Delta P$ comprising m profile deviation values, wherein $\Delta P_j = P_{0j} - P_{AVG}$ for $j=1$ through m;
   computing an inverse matrix $A_T^{-1}$;
   multiplying the inverse matrix $A_T^{-1}$ and the profile deviation vector $\Delta P$ to obtain a time deviation solution vector $\Delta T_{SOLUTION}$ comprising n' scan time deviation values, wherein $\Delta T_{SOLUTION} = A_T^{-1}*\Delta P$; and
   computing a scan time solution vector $T_{SOLUTION}$ as the sum of the time deviation solution vector $\Delta T_{SOLUTION}$ and the truncated initial time vector $T_{0T}$, the scan time solution vector $T_{SOLUTION}$ comprising the set of scan time values corresponding to the solution to the system of linear equations that reduces current density profile deviations, wherein $T_{SOLUTION} = \Delta T_{SOLUTION} + T_{0T}$.

8. The method of claim 4, further comprising:
   selectively truncating the matrix A by eliminating one or more columns having no non-zero entries to form a truncated matrix $A_T$ having m rows corresponding to the m locations along the scan direction and n' columns corresponding to the n' remaining initial voltage scan intervals and time values, wherein n' is less than n; and
   selectively truncating the initial time vector $T_0$ to form a truncated initial time vector $T_{0T}$ comprising n' initial scan time values;
   wherein the initial profile vector $P_0$ is computed as $P_0 = A_T*T_{0T}$.

9. The method of claim 1, wherein creating the system of linear equations comprises:
   forming a matrix A of the measured initial current density values with an integer number m rows corresponding to the m locations along the scan direction and an integer number n columns corresponding to n initial voltage scan intervals and time values;
   forming an initial time vector $T_0$ comprising the n initial scan time values; and
   computing an initial profile vector $P_0$ comprising m initial profile values, wherein the initial profile vector $P_0 = A*T_0$.

10. The method of claim 9, wherein determining a set of scan time values comprises:
    computing a profile average value $P_{AVG}$ as the average of the m initial profile values, wherein $P_{AVG}=(1/m)*(P_{01}+P_{02}+\ldots+P_{0m})$;
    computing a profile deviation vector $\Delta P$ comprising m profile deviation values, wherein $\Delta P_j = P_{0j} - P_{AVG}$ for $j=1$ through m;
    computing an inverse matrix $A^{-1}$;
    multiplying the inverse matrix $A^{-1}$ and the profile deviation vector $\Delta P$ to obtain a time deviation solution vector $\Delta T_{SOLUTION}$ comprising n scan time deviation values, wherein $\Delta T_{SOLUTION} = A^{-1}*\Delta P$; and
    computing a scan time solution vector $T_{SOLUTION}$ as the sum of the time deviation solution vector $\Delta T_{SOLUTION}$ and the initial time vector $T_0$, the scan time solution vector $T_{SOLUTION}$ comprising the set of scan time values corresponding to the solution to the system of linear equations that reduces current density profile deviations, wherein $T_{SOLUTION} = \Delta T_{SOLUTION} + T_0$.

11. The method of claim 10, wherein the inverse matrix $A^{-1}$ is computed using singular value decomposition (SVD).

12. The method of claim 11, further comprising:
selectively truncating the matrix A by eliminating one or more columns having no non-zero entries to form a truncated matrix $A_T$ having m rows corresponding to the m locations along the scan direction and n' columns corresponding to the n' remaining initial voltage scan intervals and time values, wherein n' is less than n; and
selectively truncating the initial time vector $T_0$ to form a truncated initial time vector $T_{0T}$ comprising n' initial scan time values;
wherein the initial profile vector $P_0$ is computed as $P_0 = A_T * T_{0T}$; and
wherein determining the set of scan time values comprises:
computing the profile average value $P_{AVG}$ as the average of the m initial profile values, wherein $P_{AVG} = (1/m)*(P_{01} + P_{02} + \ldots + P_{0m})$;
computing a profile deviation vector $\Delta P$ comprising m profile deviation values, wherein $\Delta P_j = P_{0j} - P_{AVG}$ for $j=1$ through m;
computing an inverse matrix $A_T^{-1}$;
multiplying the inverse matrix $A_T^{-1}$ and the profile deviation vector $\Delta P$ to obtain a time deviation solution vector $\Delta T_{SOLUTION}$ comprising n' scan time deviation values, wherein $\Delta T_{SOLUTION} = A_T^{-1} * \Delta P$; and
computing a scan time solution vector $T_{SOLUTION}$ as the sum of the time deviation solution vector $\Delta T_{SOLUTION}$ and the truncated initial time vector $T_{0T}$, the scan time solution vector $T_{SOLUTION}$ comprising the set of scan time values corresponding to the solution to the system of linear equations that reduces current density profile deviations, wherein $T_{SOLUTION} = \Delta T_{SOLUTION} + T_{0T}$.

13. The method of claim 9, further comprising:
selectively truncating the matrix A by eliminating one or more columns having no non-zero entries to form a truncated matrix $A_T$ having m rows corresponding to the m locations along the scan direction and n' columns corresponding to the n' remaining initial voltage scan intervals and time values, wherein n' is less than n; and
selectively truncating the initial time vector $T_0$ to form a truncated initial time vector $T_{0T}$ comprising n' initial scan time values;
wherein the initial profile vector $P_0$ is computed as $P_0 = A_T * T_{0T}$.

14. The method of claim 1, wherein the plurality of locations along the scan direction are spaced from one another by a profile interval distance that is less than a lateral dimension of an ion beam.

15. A calibration system for calibrating an ion beam scanner in an ion implantation system, the calibration system comprising:
a dosimetry system operable to measure a plurality of initial current density values at a corresponding plurality of locations along a scan direction in a workpiece location of an ion implantation system; and
a control system operably coupled with the dosimetry system and a power supply associated with a beam scanner of the ion implantation system, the control system being operable to cause the scanner to scan an ion beam across the workpiece location of the ion implantation system in the scan direction one or more times according to a plurality of initial voltage scan intervals and a corresponding plurality of initial voltage scan time values such that the dosimetry system can measure a plurality of initial current density values at a plurality of locations along a scan direction in a workpiece location of an ion implantation system;
wherein the initial current density values individually correspond to one of the plurality of initial voltage scan intervals and to one of the corresponding plurality of initial scan time values; and
wherein the control system is further operable to create a system of linear equations based on the measured initial current density values and the initial scan time values, and to determine a set of scan time values for the voltage scan intervals corresponding to a solution to the system of linear equations that reduces current density profile deviations.

16. The calibration system of claim 15, wherein the control system is operable to form a matrix A of the measured initial current density values with an integer number m rows corresponding to the m locations along the scan direction and an integer number n columns corresponding to n initial voltage scan intervals and time values, to form an initial time vector $T_0$ comprising the n initial scan time values, and to compute an initial profile vector $P_0$ comprising m initial profile values, wherein the initial profile vector $P_0 = A * T_0$.

17. The calibration system of claim 16, wherein the control system is operable to compute a profile average value $P_{AVG}$ as the average of the m initial profile values, wherein $P_{AVG} = (1/m)*(P_{01} + P_{02} + \ldots + P_{0m})$, to compute a profile deviation vector $\Delta P$ comprising m profile deviation values, wherein $\Delta P_j = P_{0j} - P_{AVG}$ for $j=1$ through m, to compute an inverse matrix $A^{-1}$, to multiply the inverse matrix $A^{-1}$ and the profile deviation vector $\Delta P$ to obtain a time deviation solution vector $\Delta T_{SOLUTION}$ comprising n scan time deviation values, wherein $\Delta T_{SOLUTION} = A_{-1} * \Delta P$, and to compute a scan time solution vector $T_{SOLUTION}$ as the sum of the time deviation solution vector $\Delta T_{SOLUTION}$ and the initial time vector $T_0$, the scan time solution vector $T_{SOLUTION}$ comprising the set of scan time values corresponding to the solution to the system of linear equations that reduces current density profile deviations, wherein $T_{SOLUTION} = \Delta T_{SOLUTION} + T_0$.

18. The calibration system of claim 17, wherein the control system is operable to compute inverse matrix $A^{-1}$ using singular value decomposition (SVD).

19. The calibration system of claim 18, wherein the control system is further operable to selectively truncate the matrix A by eliminating one or more columns having no non-zero entries to form a truncated matrix $A_T$ having m rows corresponding to the m locations along the scan direction and n' columns corresponding to the n' remaining initial voltage scan intervals and time values, wherein n' is less than n, and to selectively truncate the initial time vector $T_0$ to form a truncated initial time vector $T_{0T}$ comprising n' initial scan time values;
wherein the control system computes the initial profile vector $P_0$ as $P_0 = A_T * T_{0T}$; and
wherein the control system determines the set of scan time values by computing the profile average value $P_{AVG}$ as the average of the m initial profile values, wherein $P_{AVG} = (1/m)*(P_{01} + P_{02} + \ldots + P_{0m})$, computing a profile deviation vector $\Delta P$ comprising m profile deviation values, wherein $\Delta P_j = P_{0j} - P_{AVG}$ for $j=1$ through m, computing an inverse matrix $A_T^{-1}$, multiplying the inverse matrix $A_T^{-1}$ and the profile deviation vector $\Delta P$ to obtain a time deviation solution vector $\Delta T_{SOLUTION}$ comprising n' scan time deviation values, wherein $\Delta T_{SOLUTION} = A_T^{-1} * \Delta P$, and computing a scan time solution vector $T_{SOLUTION}$ as the sum of the time deviation solution vector $\Delta T_{SOLUTION}$ and the truncated initial time vector $T_{OT}$, the scan time solution vector $T_{SOLUTION}$ comprising the set of scan time values corresponding to the solution to the system of linear equations that reduces current density profile deviations, wherein $T_{SOLUTION} = \Delta T_{SOLUTION} + T_{OT}$.

20. The calibration system of claim 16, wherein the control system is further operable to selectively truncate the matrix A by eliminating one or more columns having no non-zero entries to form a truncated matrix $A_T$ having m rows corresponding to the m locations along the scan direction and n' columns corresponding to the n' remaining initial voltage scan intervals and time values, wherein n' is less than n;

wherein the control system selectively truncates the initial time vector $T_0$ to form a truncated initial time vector $T_{OT}$ comprising n' initial scan time values; and wherein the control system computes the initial profile vector $P_0$ as $P_0 = A_T * T_{OT}$.

* * * * *